(12) United States Patent
Noro

(10) Patent No.: US 11,260,526 B2
(45) Date of Patent: Mar. 1, 2022

(54) DRIVING CONTROL APPARATUS FOR ACTUATOR

(71) Applicant: Yamaha Corporation, Hamamatsu (JP)

(72) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 276 days.

(21) Appl. No.: 16/395,408

(22) Filed: Apr. 26, 2019

(65) Prior Publication Data

US 2019/0248008 A1 Aug. 15, 2019

Related U.S. Application Data

(63) Continuation of application No. PCT/JP2017/038747, filed on Oct. 26, 2017.

(30) Foreign Application Priority Data

Oct. 31, 2016 (JP) .............................. JP2016-213849

(51) Int. Cl.
*B25J 9/16* (2006.01)
*B25J 9/12* (2006.01)
(Continued)

(52) U.S. Cl.
CPC ............. *B25J 9/1633* (2013.01); *B25J 9/123* (2013.01); *G05B 19/416* (2013.01); *G05D 3/12* (2013.01);
(Continued)

(58) Field of Classification Search
CPC ........ B25J 9/123; B25J 9/1633; B25J 9/1075; B25J 9/142; B25J 9/126; G05B 19/416;
(Continued)

(56) References Cited

U.S. PATENT DOCUMENTS 3,875,791 A * 4/1975 Fitzgerald .............. G01N 11/14
73/54.31
2006/0207419 A1 9/2006 Okazaki et al.
(Continued)

FOREIGN PATENT DOCUMENTS

CN 101979259 A * 2/2011 ............. Y02T 10/72
CN 205186121 U * 4/2016 ................ B60T 7/04
(Continued)

OTHER PUBLICATIONS

International Search Report (PCT/ISA/210) issued in PCT Application No. PCT/JP2017/038747 dated Jan. 16, 2018 with English translation (five (5) pages).
(Continued)

*Primary Examiner* — Khoi H Tran
*Assistant Examiner* — Tanner L Cullen
(74) *Attorney, Agent, or Firm* — Crowell & Moring, LLP

(57) ABSTRACT

Provided is a driving control apparatus that can control relaxation of force in an actuator. The driving control apparatus is provided with: a driving control unit configured to control driving of the actuator according to a driving control signal; and a pressure control unit configured to control, according to a pressure control signal, involvement of the driving control signal in control of pressure to be generated by the actuator.

15 Claims, 20 Drawing Sheets

(51) Int. Cl.
  *G05B 19/416* (2006.01)
  *G05D 3/12* (2006.01)
  *H02P 25/034* (2016.01)
  *B25J 19/00* (2006.01)
  *H03K 17/687* (2006.01)

(52) U.S. Cl.
  CPC .............. *H02P 25/034* (2016.02); *B25J 19/00* (2013.01); *G05B 2219/37333* (2013.01); *H03K 17/6871* (2013.01)

(58) Field of Classification Search
  CPC ........... G05B 2219/37333; G05B 2219/40016; F15B 21/087; F15B 15/103; G05D 3/12; H02P 6/28; H02P 25/034; H03K 17/6871
  See application file for complete search history.

(56) References Cited

U.S. PATENT DOCUMENTS

| | | | | |
|---|---|---|---|---|
| 2009/0324366 A1* | 12/2009 | Okazaki | ................... | B25J 19/06 414/4 |
| 2011/0078508 A1 | 3/2011 | Komatsu et al. | | |
| 2011/0279067 A1* | 11/2011 | Murata | ................ | H02P 25/032 318/128 |
| 2012/0123564 A1* | 5/2012 | Yajima | ................... | G05B 19/19 700/33 |
| 2017/0197312 A1* | 7/2017 | Osada | ................... | B25J 9/1676 |
| 2017/0198728 A1* | 7/2017 | Noda | ................... | F15B 15/088 |
| 2018/0229610 A1* | 8/2018 | Lian | ........................ | B60L 7/18 |

FOREIGN PATENT DOCUMENTS

| | | |
|---|---|---|
| JP | 4-203602 A | 7/1992 |
| JP | 2000-141262 A | 5/2000 |
| JP | 2005-95989 A | 4/2005 |
| JP | 2014-4654 A | 1/2014 |
| JP | 2016-61302 A | 4/2016 |
| WO | WO 2010/082452 A1 | 7/2010 |

OTHER PUBLICATIONS

Japanese-language Written Opinion (PCT/ISA/237) issued in PCT Application No. PCT/JP2017/038747 dated Jan. 16, 2018 (three (3) pages).

Japanese-language Office Action issued in Japanese Application No. 2016-213849 dated Aug. 4, 2020 with English translation (four (4) pages).

Chinese-language Office Action issued in Chinese Application No. 201780066676.2 dated Aug. 4, 2021 with English translation (15 pages).

* cited by examiner

DRIVING CONTROL APPARATUS FOR ACTUATOR

CROSS REFERENCE TO RELATED APPLICATIONS

The present application is a continuation application of International Application No. PCT/JP2017/038747, filed Oct. 26, 2017, which claims priority to Japanese Patent Application No. 2016-213849, filed Oct. 31, 2016. The contents of these applications are incorporated herein by reference in their entirety.

FIELD OF INVENTION

The present invention relates to robot control technology, and more specifically relates to a driving control apparatus for an actuator that drives a movable portion using a robot.

BACKGROUND

The accuracy of controlling the position and speed of a robot arm used in current industrial robots is thought to already exceed human abilities. Also, technology has been proposed whereby it is possible to reduce inertia of a movable portion of a robot (for example, see JP 2016-61302A hereinafter called Patent Literature 1), and technology for controlling flexibility of a hand of the robot (for example, see JP 2014-4654A hereinafter called Patent Literature 2) has been proposed.

SUMMARY OF THE INVENTION

However, it is difficult to cause a robot to act like a human, and it is extremely difficult to cause a robot to play a musical instrument as if a human is playing the musical instrument.

An actuator(artificial muscle) that is used as the motive power of an ordinary robot arm or robot, although operating smoothly and accurately with respect to a driving signal, is basically rigid against external forces.

Depending on the type of actuator, there are those that are pliant (for example, see Patent Literature 2), and in order to accurately move the robot it is necessary to perform position control (position feedback). However, when performing this position control, the actuator tends to become rigid, and during normal operation the actuator is maintained at substantially the same hardness. Therefore, the behavior of the actuator is very different from the behavior of a human muscle.

For example, in an operation of "hitting a drum", actually a human analyzes the trajectory of a tip of a drum stick from an image of hitting the drum, and this operation can be reproduced with a robot arm. In the robot, control of the position of the tip of the drum stick can be realized with considerable accuracy, and it is conceivable that position control can perhaps be performed with greater accuracy than a human.

However, when only performing this sort of position control of the tip of the drum stick, a sound as if a human is hitting the drum is not produced. The reason for this is that not all of the trajectory of the drum stick is due to movement according to human intention, rather, a large portion of that trajectory is created by the reaction from the drum side. The first portion of the trajectory of the drum stick is formed by applying kinetic energy to the drum stick forcefully toward the skin of the drum with human intention. In this case the muscle is in a state such as a stiff spring, which is rigid.

When continuing to swing the drum stick until the drum stick strikes the skin in this state, the drum stick is held against the skin even though sound is produced, so free vibration of the skin is prevented. Therefore, the striking sound of the drum stick is muted, and reverberation of a drum-specific sound is not obtained. Striking the drum with the robot arm is also considered to be a state close to this.

In an actual musical performance, after force is applied to accelerate the drum stick, muscle force is removed just before striking the skin (force relaxation), and thus, kinetic energy is applied to the drum stick, causing the tip of the drum stick to strike the skin. By doing so, a coupled resonance is caused between the mass of the drum stick and the spring property of the skin, thereby generating a sound by efficiently changing the kinetic energy of the drum stick to vibration energy of the skin. Afterward, the player applies muscle force according to the timing at which the drum stick was repelled by repulsive force of the skin, thus stopping the drum stick. In this series of operations, the force of the human muscles are involved in movement of the drum stick at the time of acceleration at the beginning, and when stationary at the end. Before and after the time when sound is produced, because basically the force of the muscle is completely removed, the movement of the drum stick is decided by the drum stick and the skin of the drum. To produce a good sound, it is important that the muscle does not interfere with this movement.

However, in the driving control of the actuator, a means for enabling this sort of control of force relaxation is not provided.

The present invention has been made in view of the circumstances described above, and aims to enable control of force relaxation in driving control of the actuator.

A driving control apparatus for an actuator according to a first aspect of the invention is provided with a driving control unit configured to control driving of the actuator according to a driving control signal; and a pressure control unit configured to control, according to a pressure control signal, involvement of the driving control signal in control of pressure to be generated by the actuator.

A driving control apparatus according to a second aspect of the invention is a driving control apparatus according to the first aspect, where the driving control signal is a position error signal indicating a position error between a position detection signal indicating a position of a movable portion driven by the actuator, and a position control signal instructing a position of the movable portion.

A driving control apparatus according to a third aspect of the invention is a driving control apparatus according to the first aspect or the second aspect, further provided with a braking force control unit configured to control, according to a braking force control signal, braking force against the pressure.

A driving control apparatus according to a fourth aspect of the invention is a driving control apparatus according to the first aspect or the second aspect, further provided with a braking force control unit configured to control, according to a braking force control signal, an output impedance of a driving unit for controlling driving of the actuator.

A driving control apparatus according to a fifth aspect of the invention is a driving control apparatus according to the fourth aspect, where the braking force control unit includes a braking force control loop configured to perform control to cause the driving unit to output a driving current according to a pressure instruction signal and perform control of the output impedance of the driving unit, by performing feedback control of the driving current of the actuator. The pressure control unit is configured to generate the pressure instruction signal by performing signal processing based on the pressure control signal on the driving control signal.

A driving control apparatus according to a sixth aspect of the invention is a driving control apparatus according to the fifth aspect, where the braking force control unit configured to control, according to the braking force control signal, gain and polarity of a feedback amount of the braking force control loop.

A driving control apparatus according to a seventh aspect of the invention is a driving control apparatus according to the fifth aspect or the sixth aspect, where the pressure control unit is configured to limit the pressure instruction signal to within a limit decided by the pressure control signal.

A driving control apparatus according to an eighth aspect of the invention is a driving control apparatus according to any of the fifth to seventh aspects, where the pressure control is configured to control gain of the pressure instruction signal to the driving control signal based on the pressure control signal.

A driving control system according to a ninth aspect of the invention is provided with the driving control apparatus according to any of the first to eighth aspects, and a host computer configured to supply the driving control signal and the pressure control signal to the driving control apparatus.

A driving control system according to a tenth aspect of the invention is provided with a movable portion; an actuator configured to control driving of the movable portion; and the driving control apparatus according to any of the first to ninth aspects.

An eleventh aspect of the invention provides a driving control apparatus for an actuator, the driving control apparatus being provided with a position control unit configured to control driving of the actuator according to a position error signal indicating a position error between a position detection signal indicating a position of a movable portion driven by the actuator, and a position control signal instructing a position of the movable portion; and a pressure control unit configured to control, according to a pressure control signal, involvement of the position error signal in control of pressure to be generated by the actuator.

DETAILED DESCRIPTION OF THE PREFERRED EMBODIMENTS

Hereinafter, embodiments of the present invention will be described with reference to the drawings.

First Embodiment

Application Target of Present Embodiment

Figure 1:
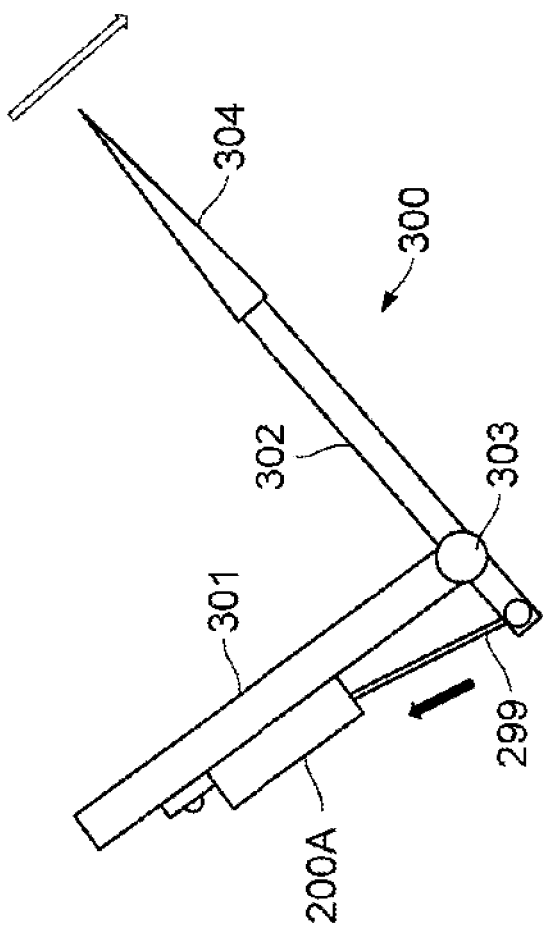
FIG. 1 shows an actuator that is an application target of a driving control apparatus according to a first embodiment of the present invention, and a robot arm to which the actuator is attached.

FIG. 1 shows an actuator 200A that is an application target of a driving control apparatus (not shown in FIG. 1) according to a first embodiment of the present invention, and a robot arm 300 to which the actuator 200A is attached. The robot arm 300 is used to play a drum. As shown in FIG. 1, the robot arm 300 has an upper arm portion 301, and a lower arm portion 302. Here, a drum stick 304 is fixed to a tip of arm portion 302. A joint 303 is provided at the tip of the upper arm portion 301. The joint 303 includes a shaft (not shown) that penetrates through a portion in the vicinity of an end on the opposite side as the drum stick 304 of the lower arm portion 302. The lower arm portion 302 is capable of rotating with the joint 303 as a fulcrum.

The actuator 200A is fixed to a lower face of the upper arm 301. The end on the opposite side as the drum stick 304 of the lower arm portion 302 is coupled to a coil holder (not shown in FIG. 1) of the actuator 200A through a connecting rod 299. In the present embodiment, by performing driving control of the actuator 200A, the robot arm 300 is caused to play a drum.

Configuration of Actuator

Figure 2:
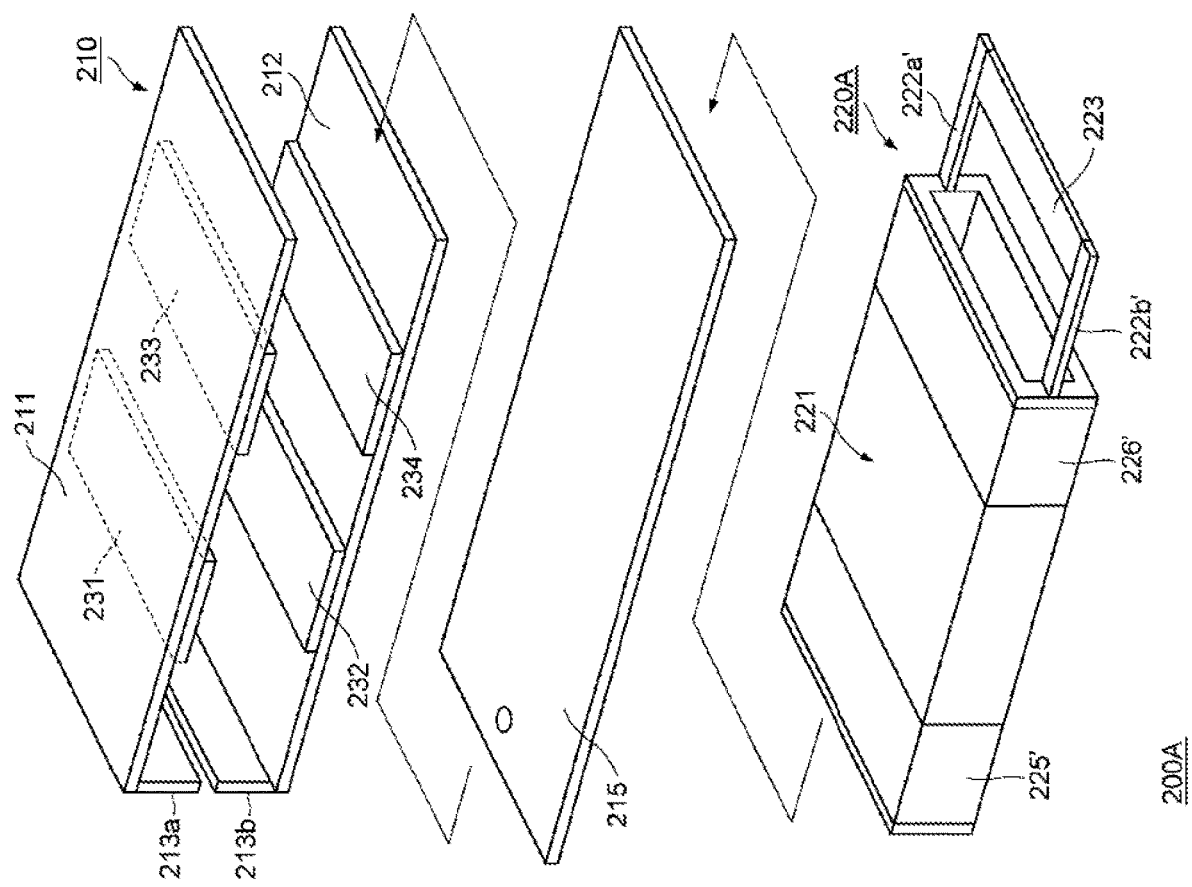
FIG. 2 is an assembly view showing the configuration of the actuator.
Figure 3:
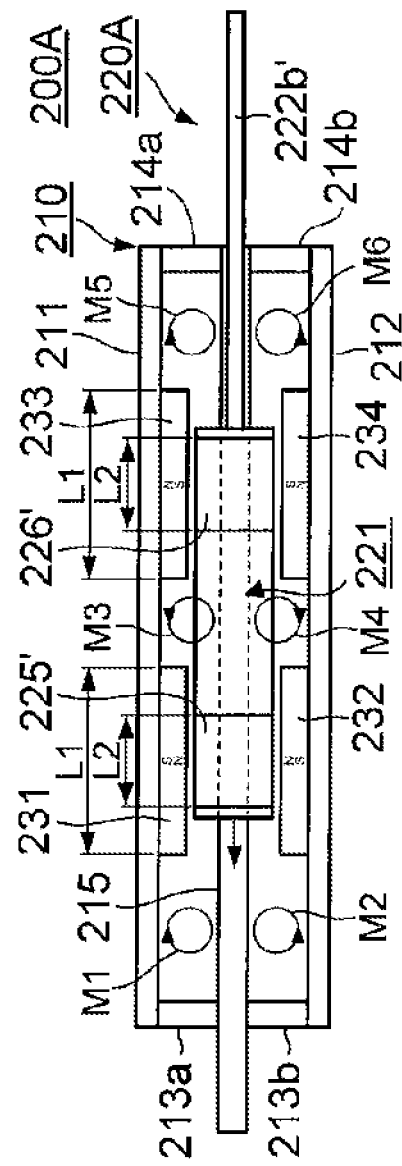
FIG. 3 is a side view showing the configuration of the actuator.
Figure 4:
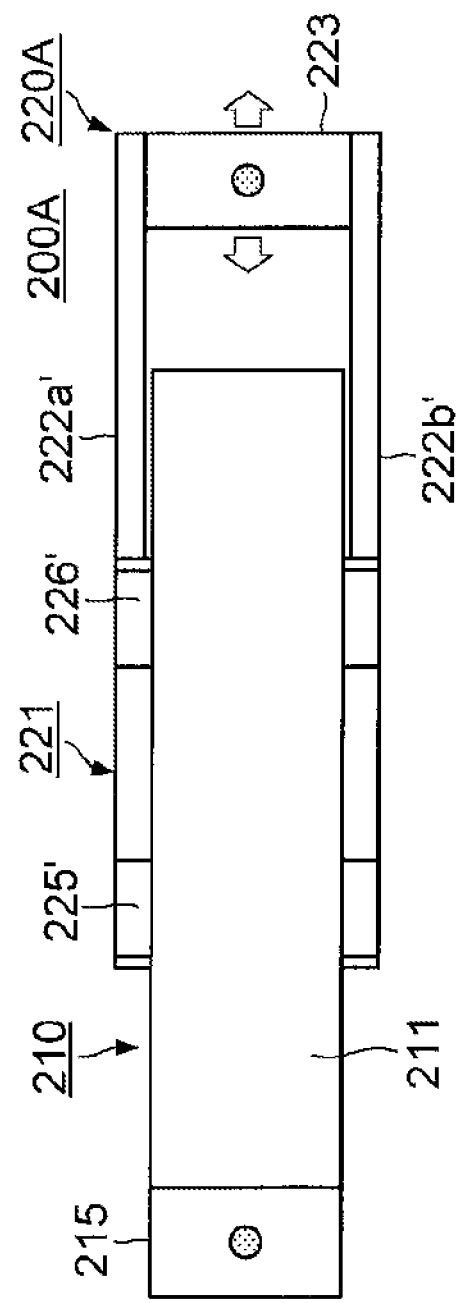
FIG. 4 is a plan view showing the configuration of the actuator.

FIG. 2 is an assembly view of the actuator 200A used in the present embodiment, FIG. 3 is a side view in which the actuator 200A is viewed from a direction perpendicular to the paper face in FIG. 1, and FIG. 4 is a plan view in which the actuator 200A is viewed obliquely from the lower left in FIG. 1. Note that below, for convenience of explanation, the term "axial direction" is used, and this "axial direction" means the left-right direction in FIGS. 3 and 4.

As shown in FIGS. 2 to 4, the actuator 200A includes a housing 210 and a coil holder 220A. The housing 210 is a substantially rectangular parallelepiped-shaped enclosure with open sides, enclosed by outer yokes 211 and 212 forming upper and lower walls, and outer yokes 213a, 213b, 214a, and 214b forming front and rear walls. Here, the outer yokes 211, 212, 213a, 213b, 214a, and 214b are respectively configured from flat rectangular magnetic bodies. Note that in FIG. 2, in order to prevent complication of the drawing, the outer yokes 214a and 214b are omitted.

The outer yokes 211 and 212 are parallel to each other, and respectively have a flat portion opposed to each other with a predetermined space therebetween. An inner yoke 215 configured from a flat rectangular magnetic body is positioned in the center of the space between the flat portions of the outer yokes 211 and 212. The inner yoke 215, from the outside of the outer yokes 213a and 213b, passes through the gap between the outer yokes 213a and 213b, and reaches into the gap between the outer yokes 214a and 214b. Respective flat portions of the front and back two surfaces of the inner yoke 215 are opposed to respective flat portions of the outer yokes 211 and 212. An end of the inner yoke 215 protruding from the outer yokes 213a and 213b is fixed to the upper arm portion 301 in FIG. 1 by a fixing tool such as an unshown bolt or the like.

The coil holder 220A includes a body 221 having a rectangular parallelepiped shape enclosing a hollow area extending in the axial direction, two bar portions 222a' and 222b' that protrude in the axial direction from two locations at both widthwise ends of one end in the axial direction of the main body 221, and a bridge portion 223 sandwiched between the ends of the bar portions 222a' and 222b'. The bridge portion 223 is coupled to an end of the connecting rod 299 in FIG. 1. Coils 225' and 226' are wound in areas near both ends in the axial direction of the body 221. The inner yoke 215 passes through the hollow area within the body 221. The body 221 is movable in the axial direction along the inner yoke 215.

Figure 5:
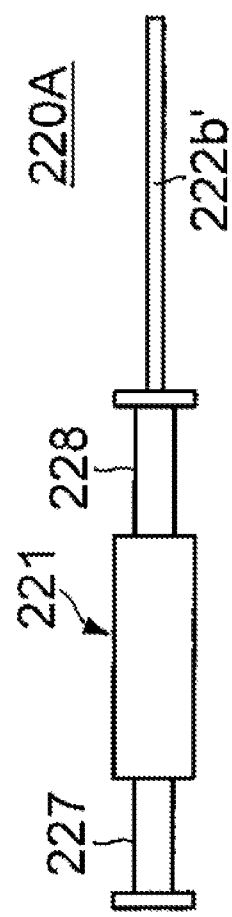
FIG. 5 is a side view showing a coil holder in a state in which coils are not wound in the actuator.
Figure 6:
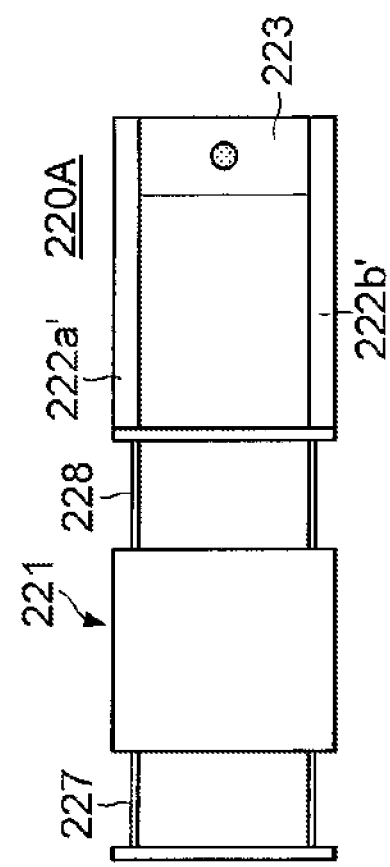
FIG. 6 is a plan view of the coil holder.

FIG. 5 is a side view showing the coil holder 220A in a state in which coils are not wound, and FIG. 6 is a plan view of the coil holder 220A. As shown in the drawings, at both ends in the axial direction of the main body 221 of the coil holder 220A, recessed portions 227 and 228 that make one circumference around the central axis of the body 221 are formed. The coils 225' and 226' in FIGS. 2 to 4 are wound around the recessed portions 227 and 228.

In the coils 225' and 226', in the side facing the outer yoke 211, there is a flat portion composed of a bundle of coil wiring parallel to the outer yoke 211. Also, in the coils 225' and 226', also in the side facing the outer yoke 212, there is a flat portion composed of a bundle of coil wiring parallel to the outer yoke 212.

As shown in FIGS. 2 to 4, the actuator 200A has four plate-like permanent magnets 231 to 234. Here, the permanent magnets 231 and 233 are spaced apart from each other in the axial direction, and are fixed to the outer yoke 211 such that magnetic pole faces are directed towards the inner yoke 215. Also, the permanent magnets 232 and 234 are spaced apart from each other in the axial direction, and are fixed to the outer yoke 212 such that magnetic pole faces are directed towards the inner yoke 215.

As shown in FIGS. 3 and 4, the spacing between the centers of the permanent magnets 231 and 233, and the spacing between the centers of the permanent magnets 232 and 234, is equal to the distance between the centers of the coils 225' and 226'. A length L1 in the axial direction of the permanent magnets 231 to 234 is equal to a magnetic pole surface area, and a length L2 in the axial direction of the coils 225' and 226' is equal to a number of wiring turns. Also, in the present embodiment, the length L1 in the axial direction of the permanent magnets 231 to 234 is longer than the length L2 in the axial direction of the coils 225' and 226'.

The relationship between the magnetic poles of the permanent magnets 231 to 234 is as follows. In FIG. 3, regarding the permanent magnet 231, up is the S pole, and down is the N pole. Regarding the permanent magnet 232, up is the N pole, and down is the S pole. Regarding the permanent magnet 233, up is the N pole, and down is the S pole, and regarding the permanent magnet 234, up is the S pole, and down is the N pole. Thus, in the present embodiment, when focusing on a permanent magnet whose position in the axial direction is the same, the orientation of the magnetic poles of the permanent magnet is reversed between the sides of the outer yoke 211 and the outer yoke 212 of the inner yoke 215, and when focusing on one side of the inner yoke 215 (for example, the outer yoke 211 side), the orientation of the magnetic poles of the permanent magnets adjacent to each other in the axial direction are reversed. Therefore, in the actuator 200A, magnetic flux flow occurs through each of six different magnetic paths M1 to M6, as described below.

First magnetic path M1: permanent magnet 231→inner yoke 215→outer yoke 213a→outer yoke 211→permanent magnet 231

Second magnetic path M2: permanent magnet 232→inner yoke 215→outer yoke 213b→outer yoke 212→permanent magnet 232

Third magnetic path M3: permanent magnet 231→inner yoke 215→permanent magnet 233→outer yoke 211→permanent magnet 231

Fourth magnetic path M4: permanent magnet 232→inner yoke 215→permanent magnet 234→outer yoke 211→permanent magnet 232

Fifth magnetic path M5: permanent magnet 233→outer yoke 211→outer yoke 214a→inner yoke 215→permanent magnet 233

Sixth magnetic path M6: permanent magnet 234→outer yoke 212→outer yoke 214b→inner yoke 215→permanent magnet 234

Above is described the configuration of the actuator 200A.

In this actuator 200A, by passing currents to the coils 225' and 226' that are inverse to each other, the coil holder 220A is caused to generate force in the axial direction, and thus it is possible to move the coil holder 220A in parallel motion along the inner yoke 215. In a state where no current flows to the coils 225' and 226', driving force to the coils 225' and 226' is not generated, resulting in a state of force relaxation.

According to the actuator 200A, by the plate-like permanent magnets 231 to 234, an even magnetic field is generated between the respective plate-like outer yokes 211 and 212, and the plate-like inner yoke 215. Also, because the coils 225' and 226' having a rectangular parallelepiped shape are disposed in this magnetic field, it is possible to realize the actuator 200A obtained with light weight and high driving force.

Assuming that the coils 225' and 226' are formed in a cylindrical shape, as in an actuator for a conventional speaker, it is necessary to form a magnetic circuit composed of an outer yoke, an inner yoke, and a permanent magnet in a likewise cylindrical shape, and this requires magnetic material having a large weight.

However, in this actuator 200A, because the coils 225' and 226' having a rectangular parallelepiped shape are adopted as described above, the permanent magnets 231 to 234, the outer yokes 211 and 212, and the inner yoke 215 that together constitute the magnetic circuit can be formed in a plate-like shape, so it is possible to realize the lightweight actuator 200A with a small amount of magnetic material.

Also, the coils 225' and 226', as shown in FIGS. 2 to 4, are formed in a flat rectangular parallelepiped shape having upper and lower flat portions facing the outer yokes 211 and 212. Thus, perpendicular to the magnetic flux passing through the magnetic paths M1 to M6, the total winding length of the coil windings of the flat portions that contribute to generating driving force is longer than the total winding length of the coil windings of the side portions perpendicular to the flat portions, so it is possible to generate a high driving force.

Also, in the actuator 200A, the length L1 in the axial direction of the permanent magnets 231 to 234 is longer than the length L2 in the axial direction of the coils 225' and 226'. Accordingly, when the coil 225' (226') has been moved in the axial direction, in a range where the surface area of the overlapping area between the coil 225' (226') and the permanent magnets 231 and 232 (233 and 234) is the same, it is possible to maintain a linear relationship between the current that flows in the coils of the coil holder 220A and the force that acts on the coil holder 220A.

Also, as shown in FIG. 3, among respective sections obtained by dividing the housing 210 of the actuator 200A into three sections, the magnetic paths M1 and M2 are established in the section on the left side in FIG. 3, the magnetic paths M3 and M4 are established in the middle section, and the magnetic paths M5 and M6 are established in the section on the right side, so it is possible to shorten the respective magnetic path lengths of the magnetic paths M1 to M6. Accordingly, it is not necessary to increase the cross-sectional area of the respective magnetic paths M1 to M6 in order to reduce the magnetic resistance of the magnetic paths M1 to M6. Accordingly, with this meaning as well, it is possible to reduce the weight of the actuator 200A by using less magnetic material.

Also, in the actuator 200A, a driving force for the coil holder 220A is generated by the two coils 225' and 226' arranged in the axial direction, so it is possible to obtain a high driving force.

As described above, it is possible to realize an actuator 200A that is light weight, and obtains high driving force, and can control force relaxation. Therefore, with this actuator 200A, it is possible to realize a robot capable of playing a musical instrument.

Above is described the configuration of the actuator 200A in the present embodiment.

Model of Musical Instrument Performance by a Human

Figure 7:
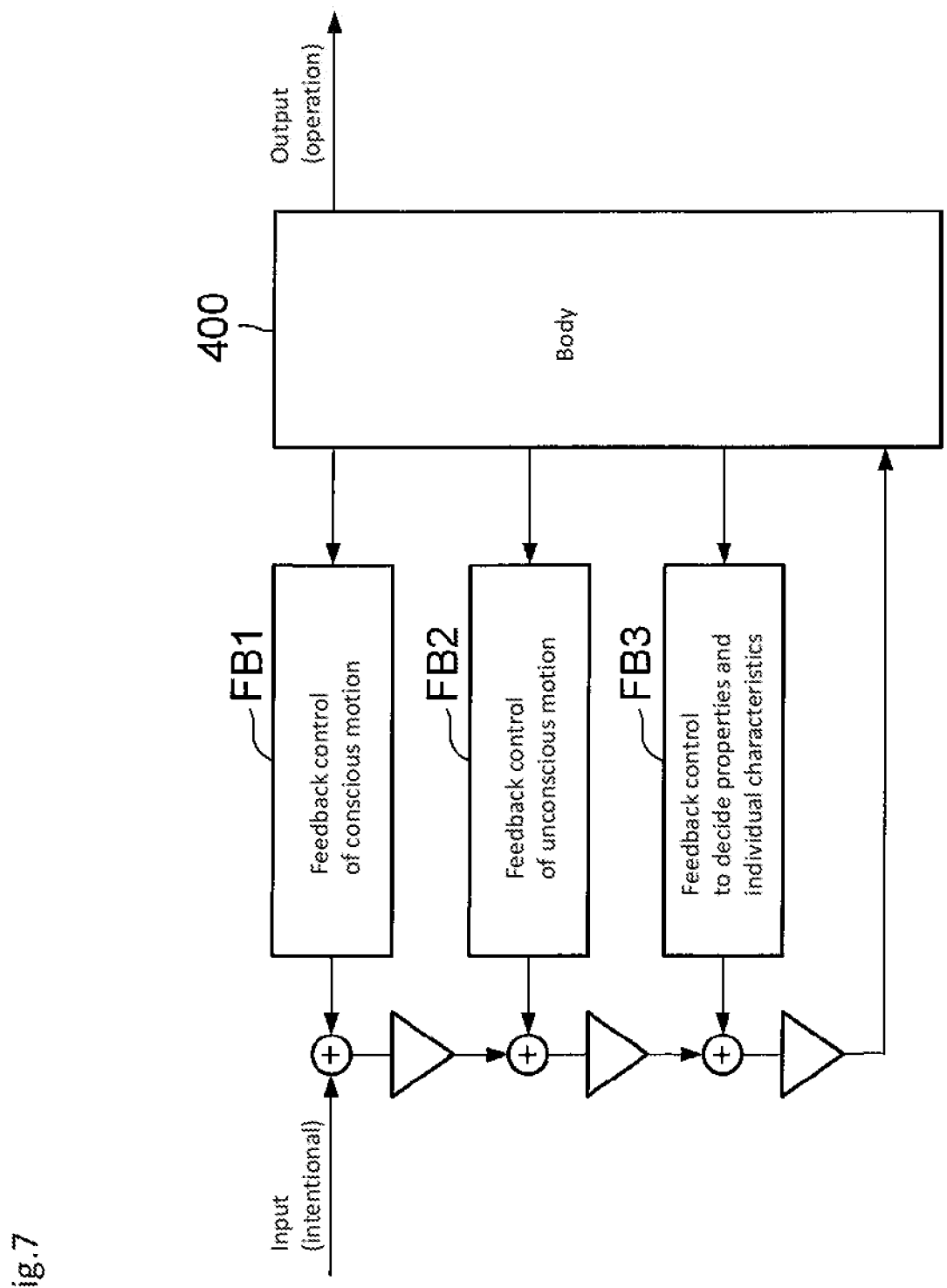
FIG. 7 is a block diagram showing the configuration in a model of a musical instrument performance by a human.

FIG. 7 is a block diagram showing a model of a musical instrument performance by a human. As shown in FIG. 7, when a human plays a musical instrument, in addition to a feedback control FB1 of conscious motion, a feedback control FB2 of unconscious motion and a feedback control FB3 that decides properties and individual characteristics also operate.

In the feedback control FB2 of unconscious motion, for example in drum playing, there is pressure control (force relaxation control) in which, after strongly swinging the stick, force is relaxed, and the body is entrusted to a reaction from the drum side. Also, in the feedback control FB3 that decides properties and individual characteristics, for example in drum playing, there is stick braking caused by muscle viscosity.

In a conventional actuator system, only the feedback control FB1 is realized, and the feedback controls FB2 and FB3 are not realized. In the present embodiment, in the actuator system, in addition to the feedback control FB1, the feedback controls FB2 and FB3 are realized.

Overview of Actuator System in Present Embodiment

Figure 8:
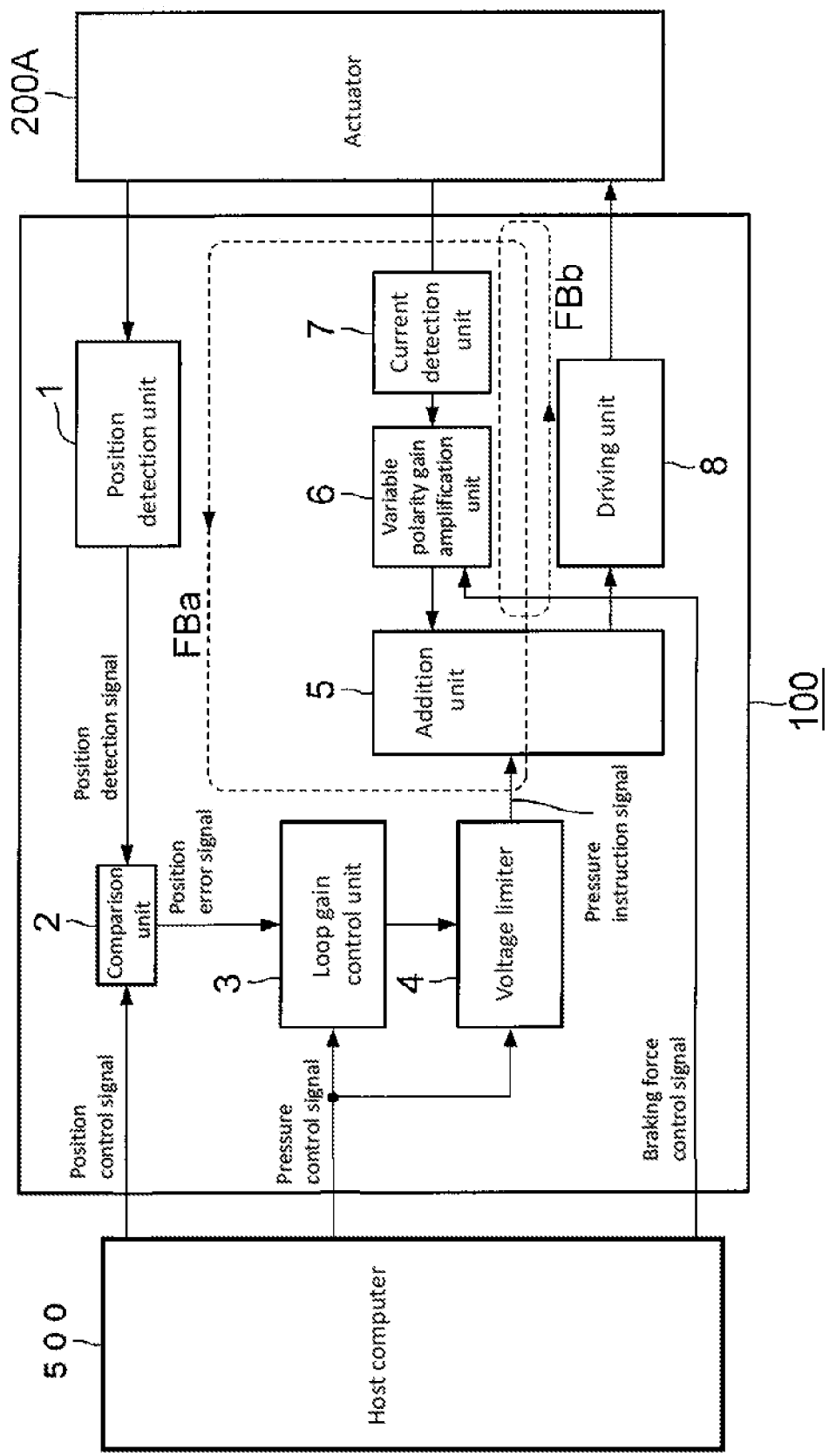
FIG. 8 is a block diagram showing the configuration of an actuator system according to a first embodiment of the present invention.

FIG. 8 is a block diagram showing a schematic configuration of an actuator system in the present embodiment.

The actuator system is configured from the actuator 200A, and a driving control apparatus 100 according to the present embodiment. As shown in FIG. 8, the driving control apparatus 100 includes a position detection unit 1, a comparison unit 2, a loop gain control unit 3, a voltage limiter 4, an addition unit 5, a variable polarity gain amplification unit 6, a current detection unit 7, and a driving unit 8.

In FIG. 8, a loop that includes the actuator 200A, the position detection unit 1, the comparison unit 2, and the driving unit 8 constitutes a position control loop FBa that matches the position of a movable portion that is a driving target of the actuator 200A (the position of the tip of the drum stick 304 in the present embodiment) to the position indicated by a position control signal.

In this position control loop FBa, the position detection unit 1 is a means for detecting the position of the movable portion driven by the actuator 200A, and generating a position detection signal indicating the detection result. The comparison unit 2 is a means for generating a position error signal indicating an error between the position indicated by the position control signal and the position indicated by the position detection signal. The position error signal becomes a pressure indication signal through the loop gain control unit 3 and the voltage limiter 4, and is supplied to the driving unit 8 through the addition unit 5. The driving unit 8 drives the coils of the actuator 200A according to the pressure instruction signal supplied in this way, thus driving the movable portion with the actuator 200A. In this way, position control that matches the position of the movable portion to the position indicated by the position control signal is performed.

Following is a description of how to realize, in this actuator system, the feedback control FB2 of unconscious motion and the feedback control FB3 to decide properties and individual characteristics, described above in FIG. 7.

In order to realize the feedback control FB2 of unconscious motion described above, it is necessary to realize control of "force relaxation" in the actuator system. However, braking that acts on the actuator 200A is a hindrance to realizing control of "force relaxation". The reason for this is as follows.

Ordinarily, a linear amplifier or a PWM amplifier that drives an electrodynamic actuator is adapted to perform essentially constant voltage driving. When an actuator is connected to this sort of an amplifier, current flows from the amplifier to a coil of the actuator, torque works in the coil so the coil moves, and thereby a counter electromotive force is generated in the coil. Regenerative current flows through the coil when the counter electromotive force exceeds the driving voltage of the coil, and electromagnetic braking is applied to the coil. In constant voltage driving, this sort of electromagnetic braking is likely to occur, which becomes a hindrance for realizing "force relaxation". In the actuator system, in order to realize the "force relaxation", it is necessary to drive the actuator 200A without generating any electromagnetic braking force. Therefore, it is necessary to drive the actuator 200A with high impedance (constant current driving).

On the other hand, the viscous resistance of a muscle itself acts as a braking element. In order to realize the feedback control FB3 to decide properties and individual characteristics described above in FIG. 7 in the actuator system, it is necessary to perform constant current driving of the actuator 200A in order to cause this braking element to act appropriately. Also, it is necessary for the braking element to constantly function, and the braking element should not be affected by other control elements. Therefore, the braking element should be realized by a fast control loop that is innermost.

Consequently, in the actuator system shown in FIG. 8, there is provided a braking force control loop FBb constituted from the actuator 200A, the current detection unit 7, the variable polarity gain amplification unit 6, the addition unit 5, and the driving 8.

Here, the current detection section 7 detects current flowing through the coils of the actuator 200A, and outputs this as a current detection signal. This current detection signal is supplied to the addition unit 5 through the variable polarity gain amplification unit 6. With the addition unit 5, a signal is output that corresponds to the difference between the pressure instruction signal output by the voltage limiter 4 and the current detection signal supplied through the variable polarity gain amplification unit 6. The driving unit 8 drives the coils of the actuator 200A according to the output signal of the addition unit 5. With this sort of feedback control, constant current driving of the coils of the actuator 200A by the driving unit 8 is performed.

It is necessary to change the actual muscle braking force depending on the individual characteristics of the presumed muscle, operating stability required when actually moving an object, or the like. This sort of braking force control is realized by controlling constant current driving with the braking force control loop FBb.

Also, in the present embodiment, in order to increase the electromagnetic braking force, negative impedance driving is adopted. Specifically, in the present embodiment, switching the gain and the polarity when the variable polarity gain amplifier unit 6 amplifies and outputs the current detection signal is performed according to the braking force control signal. Thus, it is possible to cause the braking force control loop FBb to operate as a current negative feedback circuit or a current positive feedback circuit. Also, when operating the braking force control loop FBb as a current positive feedback circuit, a negative impedance is used for the output impedance of the driving unit 8, so it is possible to obtain a high electromagnetic braking force.

Following is a description of how to realize, in the actuator system, the feedback control FB2 of unconscious motion, described above in FIG. 7.

In order to realize the feedback control FB2, a means for simulating control of "force relaxation" and "rigidity" (control of "straining") of a muscle is necessary. Here, when simulating a muscle by a spring, "force relaxation" and "rigidity" of the muscle can be regarded as a change in the spring constant.

In a spring, displacement from an initial position is proportional to force. Therefore, the error between the position of the movable portion driven by the actuator 200A and the position indicated by the position control signal is detected as a position error signal. By feeding back a pressure instruction signal proportional to the displacement (distance) indicated by the position error signal to the addition unit 5, the actuator 200A can be allowed to function as a spring. By changing the degree of involvement of the position error signal in driving control of the actuator 200A, specifically by changing the amount of feedback to driving control of the actuator 200A, it is possible to change the spring constant of the actuator 200A. Therefore, in the present embodiment, the loop gain control unit 3, which changes the amount of feedback of the position error signal depending on the pressure control signal, is provided.

In an ordinary spring, if displacement increases, force (pressure) also proportionally increases. However, in the case of a human muscle, when displacement is large, operation occurs so as to press with a constant force, so it is necessary to use a function that causes force (pressure) to be constant.

Here, the force (driving force) generated by the actuator 200A can be made constant by setting the current flowing through the coils of the actuator 200A to a constant value. Therefore, it is conceivable to provide a variable current limiter function in the driving unit 8. However, when a variable current limiter function is provided in the driving unit 8, this interferes with the ability to control the braking force of the actuator 200A.

On the other hand, the input voltage to the braking force control loop FBb (input voltage to the addition unit 5) is a pressure instruction signal indicating the pressure to be generated by the actuator 200A, and is supplied through the loop gain control unit 3. Therefore, in the actuator system shown in FIG. 8, in order to realize a constant pressure while enabling control of the braking force, a means for controlling the limit of involvement of the position error signal in the driving control of the actuator 200A is provided, specifically, the voltage limiter 4 that limits the output voltage of the loop gain control unit 3 that controls "straining" and "pressure" is provided.

Above is described an overview of the driving control apparatus 100 for an actuator according to the present embodiment.

Specific Configuration Example of Driving Control Apparatus for Actuator

Figure 9:
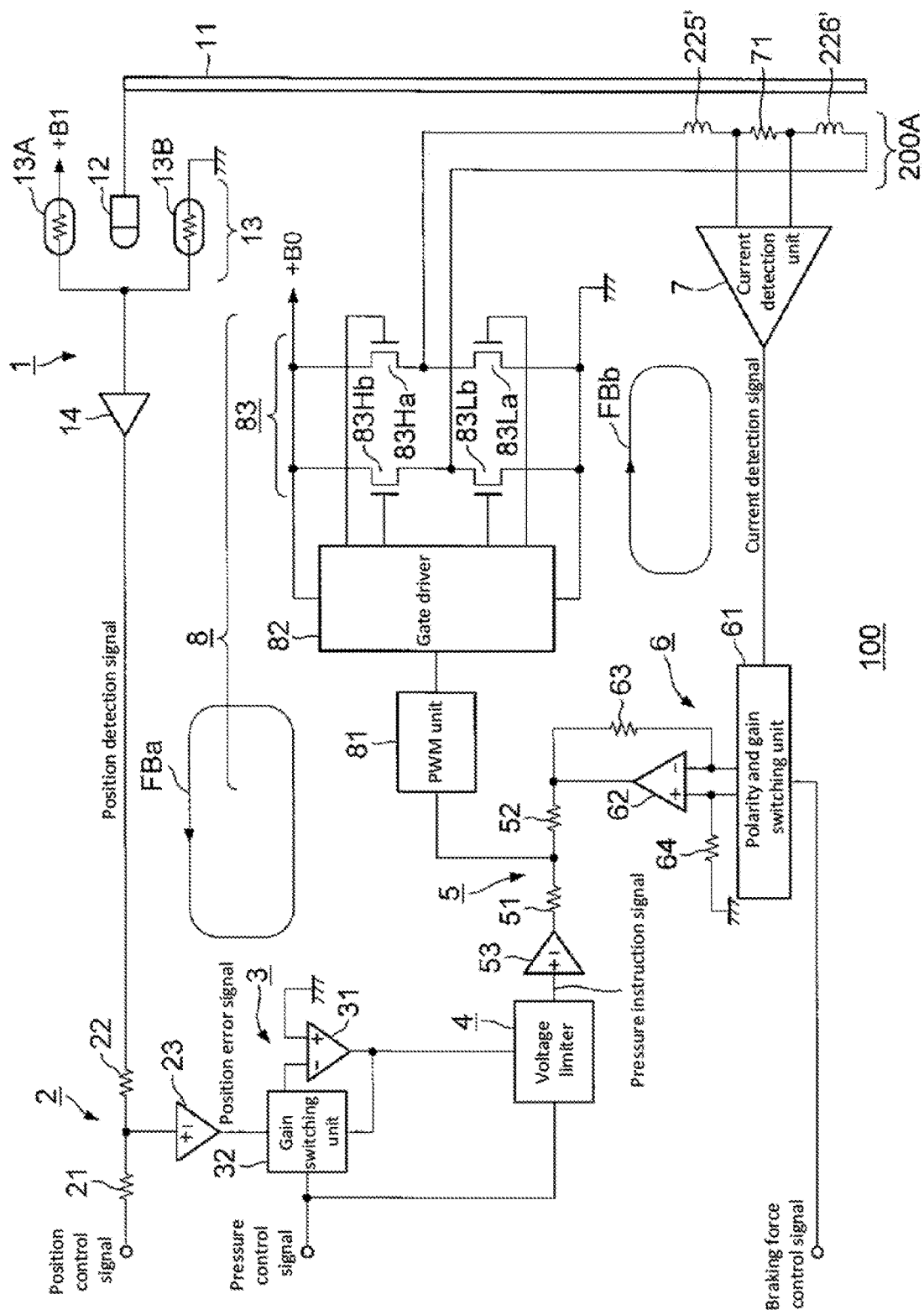
FIG. 9 is a circuit diagram showing a configuration example of the driving control apparatus for the actuator in the same embodiment.

FIG. 9 is a circuit diagram showing a specific configuration example of the driving control apparatus 100 for an actuator according to the present embodiment. Note that in FIG. 9, for ease of understanding the role of the driving control apparatus 100 in an actuator system, the configuration of the actuator 200A is shown in addition to the driving control apparatus 100.

In the example shown in FIG. 9, the optical position detection unit 1 is used. A light source 12 is fixed to a movable portion 11 driven by the actuator 200A. Here, the movable portion 11 includes the coil holder 220A shown in FIG. 2, and the connecting rod 299, the upper arm 302, and the drum stick 304 shown in FIG. 1. The light source 12 is fixed to a location in the movable portion 11 that moves linearly, that is, the light source 12 is fixed to the coil holder 220A. The light source 12 moves along a path between light receiving elements 13A and 13B along with the linear movement of the coil holder 220A. Specifically, the light source 12 is configured from two LEDs fixed near the center in the axial direction of the body 221 of the coil holder 220A shown in FIGS. 3 to 6. One of these two LEDs emits light towards the left side in the axial direction, and the other emits light towards the right side in the axial direction. Two LEDs are used as the light source 12 in order to equalize the amount of light emitted towards both sides in the axial direction. The light-receiving elements 13A and 13B are respectively fixed to the vicinity of both ends in the axial direction of the housing 210 shown in FIGS. 3 and 4. These light receiving elements 13A and 13B are elements whose resistance value changes according to the amount of light received, and constitute a voltage dividing circuit 13 that divides the voltage of a power source +B1.

The position detection unit 1, by detecting the position of the light source 12 on the path between the light receiving elements 13A and 13B, detects the position of the tip of the drum stick 304 in conjunction with the light source 12. When the light source 12 separates from the light receiving element 13B and approaches the light receiving element 13A, the resistance value of the light receiving element 13A decreases and the resistance value of the light receiving element 13B increases, and the output voltage of the voltage dividing circuit 13 increases. On the other hand, when the light source 12 separates from the light receiving element 13A and approaches the light receiving element 13B, the resistance value of the light receiving element 13B decreases and the resistance value of the light receiving element 13A increases, and the output voltage of the voltage dividing circuit 13 decreases.

In this way, an output voltage that increases or decreases according to the position of the tip of the drum stick 304 is obtained from the voltage dividing circuit 13. A variable gain amplifier 14 amplifies with a gain that specifies the output voltage of the voltage dividing circuit 13, and outputs this as a position detection signal indicating the position of the tip of the drum stick 304.

Figure 10:
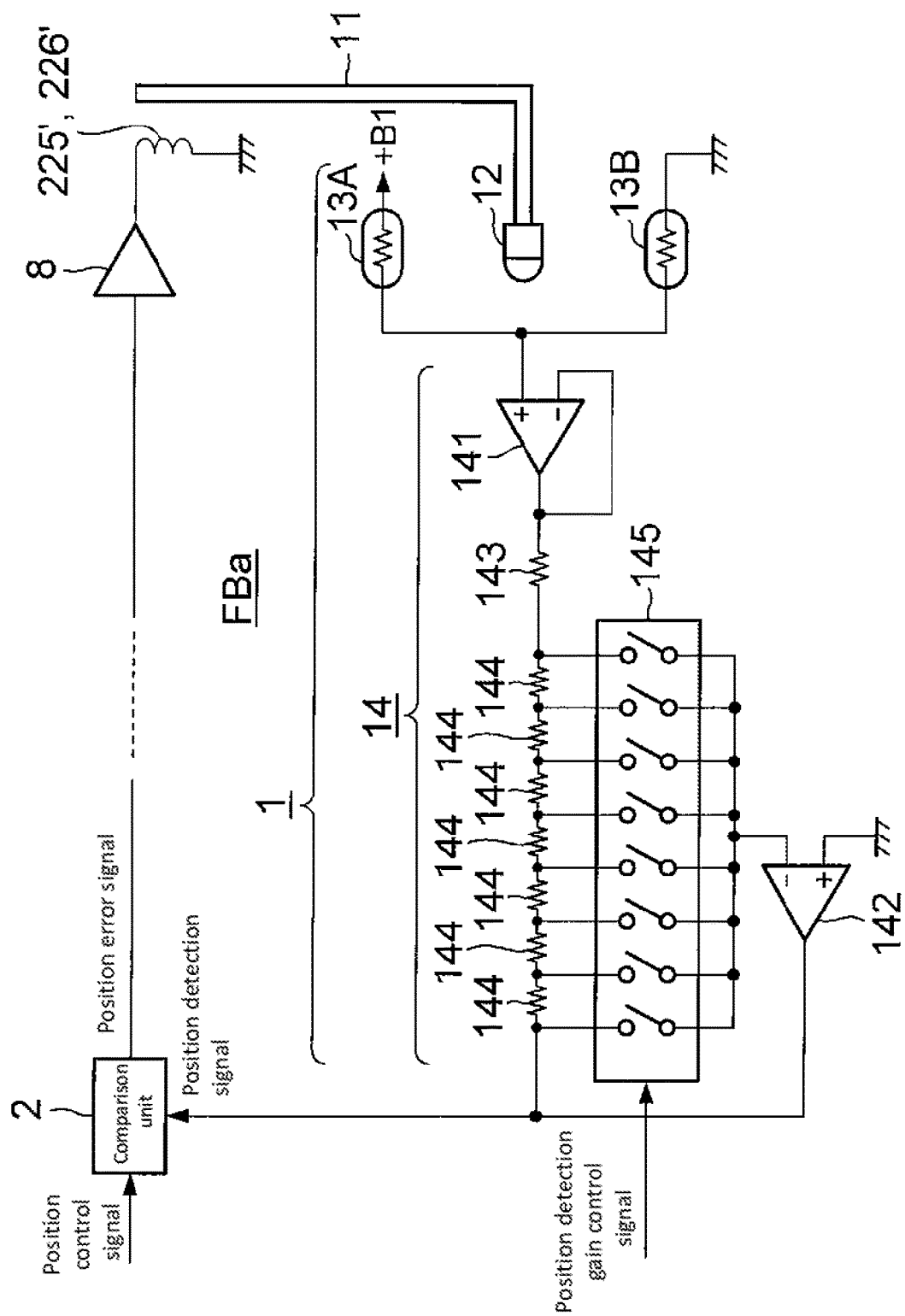
FIG. 10 is a circuit diagram showing a configuration example of a position control loop in the driving control apparatus.

FIG. 10 shows a specific configuration example of the variable gain amplifier 14. In this example, the variable gain amplifier 14 is provided with a voltage follower composed of an operational amplifier 141 and an operational amplifier 142 where a non-inverting input terminal is grounded. The variable gain amplifier 14 is further provided with a resistor 143 having one end connected to the output terminal of the operational amplifier 141, and seven resistors 144 connected in series between an output terminal of the operational amplifier 142 and the other end of the resistor 143. The variable gain amplifier 14 further includes a switch circuit 145 that connects to an inverting input terminal of the operational amplifier 142 by selecting one end of both ends of the seven resistors 144 according to a position detection gain control signal supplied from outside. The position detection signal is output from the operational amplifier 142 of the variable gain amplifier 14 to the comparison unit 2. Note that the seven resistors 144 may have resistance values equal to each other, or they may be different.

According to this configuration, a ratio of the total resistance value between the output terminal of the operational amplifier 141 and the inverting input terminal of the operational amplifier 142, and the total resistance value between the inverting input terminal of the operational amplifier 142 and the output terminal, is switched according to the position detection gain control signal. Thus, the gain of the variable gain amplifier 14 is switched.

Figure 11:
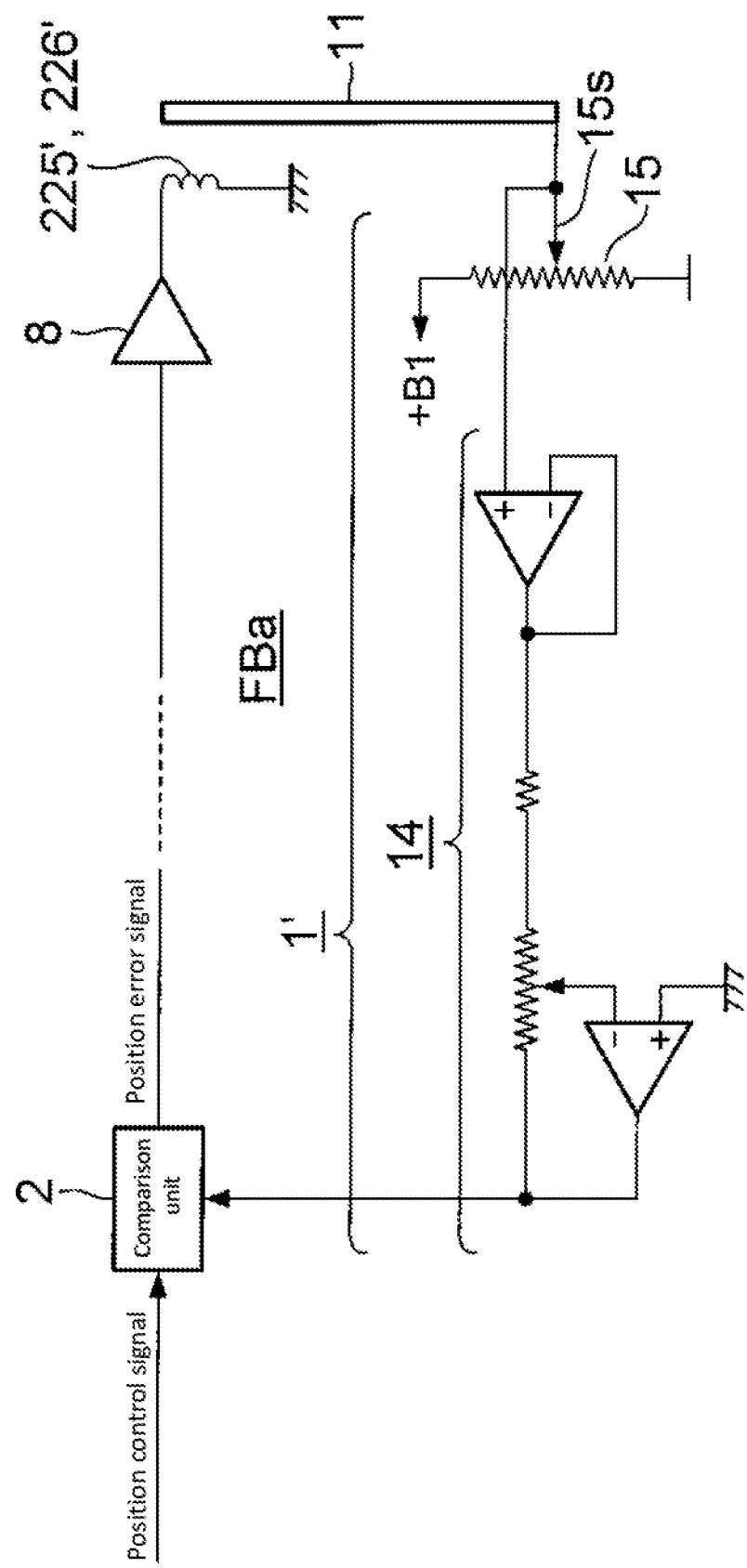
FIG. 11 is a circuit diagram showing another configuration example of the position control loop in the driving control apparatus.

Instead of the optical position detection unit 1, a mechanical position detection unit 1' shown for example in FIG. 11 may be adopted. In the position detection unit 1', the light source 12 in the position detection unit 1, and the light receiving elements 13A and 13B, are replaced by a sliding resistor 15 that functions as a voltage dividing circuit. Here, a slider 15s of the sliding resistor 15 slides the sliding resistor 15 in conjunction with the movable portion 11 driven by the actuator 200A. The output voltage of the voltage dividing circuit obtained from this slider 15s is input to the variable gain amplifier 14. The configuration of the variable gain amplifier 14 is similar to that shown in FIG. 10.

In FIG. 9, the comparison unit 2 includes resistors 21 and 22, and a buffer 23 having a gain +1, and generates a position error signal indicating the error between the position indicated by the position control signal and the position detection signal.

The loop gain control unit 3, in the example shown in FIG. 9, is configured from an operational amplifier 31 where a non-inverting input terminal is grounded, and a gain switching unit 32 inserted between an inverting input terminal and an output terminal of the operational amplifier 31. The variable gain amplifying unit 3 amplifies and outputs the position error signal output by the comparison unit 2 with a gain corresponding to the pressure control signal.

The voltage limiter 4 limits the output signal of the variable gain amplifier 3 to within a limit voltage decided according to the pressure control signal, and outputs this as a pressure instruction signal.

The addition unit 5 is configured from resistors 51 and 52, and a buffer 53 where the gain is +1. The addition unit 5 adds the output signal of the voltage limiter 4 and the output signal of the variable polarity gain amplification unit 6, and outputs the result.

The driving unit 8 is configured from a PWM unit 81, a gate driver 82, and an output stage 83.

The PWM unit 81 outputs a PWM pulse stream subjected to pulse width modulation by the output signal of the addition unit 5.

The output stage 83 is configured from N channel MOSFETs (Metal Oxide Semiconductor Field Effect Transistors; hereinafter, simply referred to as transistors) 83Ha, 83Hb, 83La, and 83Lb. Here, regarding the transistors 83Ha and 83Hb, a drain of each is connected to a power source +B0, and a source of each is connected to the respective drains of the transistors 83La and 83Lb. Also, the sources of the transistors 83La and 83Lb are grounded. Also, the coils 225' and 226' of the actuator 200A, and a current detection resistor 71, are connected in series between a connection node of the source of the transistor 83Ha and the drain of the transistor 83La, and a connection node of the source of the transistor 83Hb and the drain of the transistor 83Lb.

The gate driver 82 is, for example, a circuit that supplies a gate-source voltage to each transistor, such that when the output signal of the PWM unit 81 is at the L level, a group of the transistors 83Ha and 83Lb is ON, and a group of the transistors 83Hb and 83La is OFF. The gate driver 82 of this example supplies a gate-source voltage to each transistor, such that when the output signal of the PWM unit 81 is at the H level, the group of the transistors 83Ha and 83Lb is OFF, and the group of the transistors 83Hb and 83La is ON.

The current detection unit 7 is a circuit that detects the voltage across the current detection resistor 71, and outputs a current detection signal that indicates the current flowing through the coils 225' and 226'.

The variable polarity gain amplification unit 6 is configured from a polarity and gain switching unit 61, an operational amplifier 62, a resistor 63 connected between an output terminal of the operational amplifier 62 and an inverting input terminal, and a resistor 64 connected between a non-inverting input terminal of the operational amplifier 62 and a ground line. The variable polarity gain amplification unit 6 is a means for controlling the braking force generated by the actuator 200A, and performing positive phase or inverse amplification of a current detection signal with a gain and polarity corresponding to a braking force control signal, and outputting the result from the operational amplifier 62 to the addition unit 5.

Figure 12:
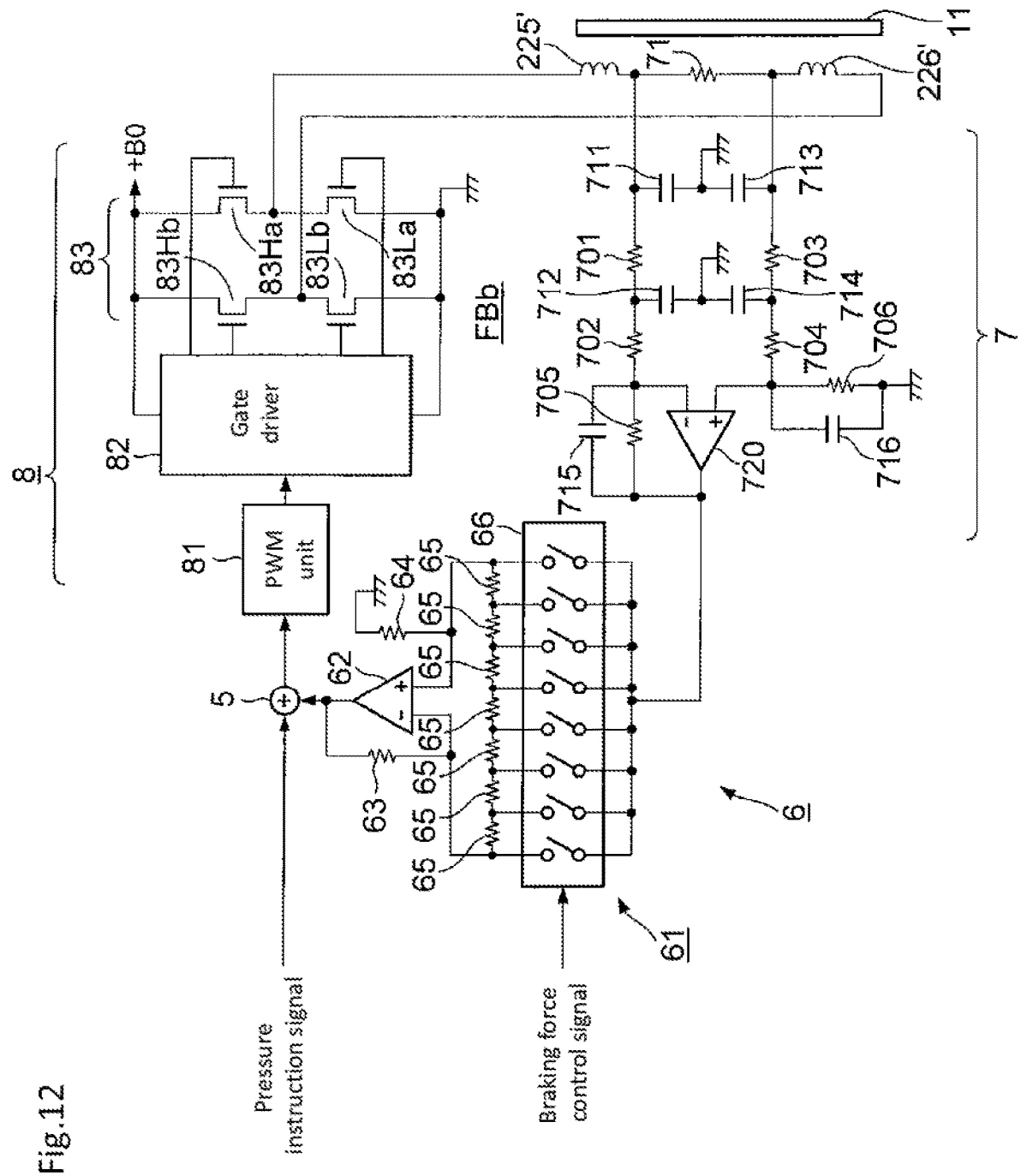
FIG. 12 is a circuit diagram showing a configuration example of a braking force control loop in the driving control apparatus.

FIG. 12 is a circuit diagram showing the detailed configuration of the driving unit 8, the current detection unit 7, and the variable polarity gain amplification unit 6.

As shown in FIG. 12, the current detection 7 is configured from resistors 701 to 706, capacitors 711 to 716, and an operational amplifier 720. Here, the resistors 701 and 702 are connected in series between a connection node between the coil 225' and the current detection resistor 71, and an inverting input terminal of the operational amplifier 720. Also, the resistors 703 and 704 are connected in series between a connection node between the coil 226' and the current detection resistor 71, and a non-inverting input terminal of the operational amplifier 720. The capacitor 711 is connected between a connection node between the resistor 701 and the current detection resistor 71, and a ground line. The capacitor 712 is connected between a connection node between the resistors 701 and 702, and the ground line. The capacitor 713 is connected between a connection node between the resistor 703 and the current detection resistor 71, and the ground line. The capacitor 714 is connected between a connection node between the resistors 703 and 704, and the ground line. The resistor 705 and the capacitor 715 are connected in parallel between the output terminal and the inverting input terminal of the operational amplifier 720, and the resistor 706 and the capacitor 716 are connected in parallel between the non-inverting input terminal of the operational amplifier 720 and the ground line.

The current detection unit 7 removes a frequency component of a carrier used to generate the PWM pulse stream in the PWM unit 81 from the voltage across the current detection resistor 71. Also, the current detection unit 7 outputs a remaining low frequency component as a current detection signal from the operational amplifier 720.

The polarity and gain switching unit 61 of the variable polarity gain amplification unit 6 is configured from seven resistors 65 connected in series between the inverting input terminal and the non-inverting input terminal of the operational amplifier 62, and a switch circuit 66. The switch circuit 66, according to a braking force control signal, connects the output terminal of the operational amplifier 720 to any one end among the respective ends of these seven resistors 65.

The variable polarity gain amplification unit 6, by controlling the output impedance of the driving unit 8 according to the braking force control signal, serves to control the braking force generated in the actuator 200A. Below, this is described in detail.

Figure 13:
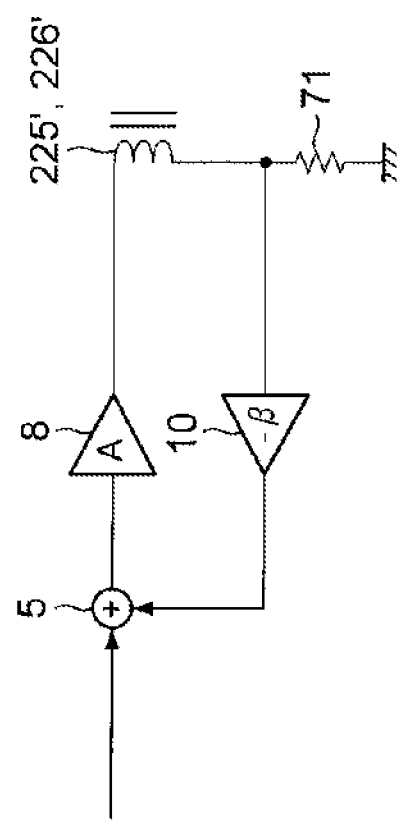
FIG. 13 is a circuit diagram showing a configuration example of a constant current driving circuit.
Figure 14:
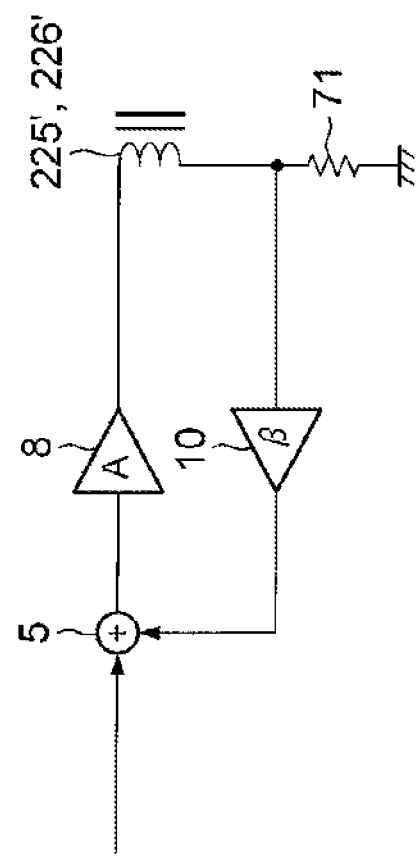
FIG. 14 is a circuit diagram illustrating an output impedance of a driving circuit in a constant current driving circuit.

FIGS. 13 and 14 show a configuration in which the current detection unit 7 and the variable polarity gain amplification unit 6 in FIG. 12 are combined, and this is shown as an amplifier 10. As shown in FIG. 13, when the gain of the amplifier 10 is $-\beta$, that is, when the amplifier 10 inverts the polarity of the voltage across the current detection resistor 71, and outputs this as a multiple of $\beta$, in the circuit shown in FIG. 12, current negative feedback is performed, and constant current driving of the coils 225' and 226' of the actuator 200A is performed.

On the other hand, when the gain of the amplifier 10 is $\beta$ as shown in FIG. 14, that is, when the amplifier 10 performs positive phase amplification of the voltage across the current detection resistor 71 as a multiple of $\beta$, in the circuit shown in FIG. 12, the current positive feedback is performed, and the output impedance of the driving unit 8 becomes a negative impedance. More specifically, where the gain of the driving unit 8 is A, and the resistance value of the current detection resistor 71 is Rs, an output impedance Zo of the driving unit 8 is given by the following equation.

$$Zo=(1-A\cdot\beta)Rs \quad (1)$$

In this state where the output impedance Zo of the driving unit 8 is a negative impedance, braking force is generated in the actuator 200A.

Therefore, in the present embodiment, the variable polarity gain amplification unit 6 is provided. Thus, a current control feedback loop composed of the addition unit 5, the driving unit 8, the coils 225' and 226', the current detection unit 7, and the variable polarity gain amplification unit 6 is sequentially switched between the state shown in FIG. 13 and the state shown in FIG. 14 according to the braking force control signal.

Figure 15:
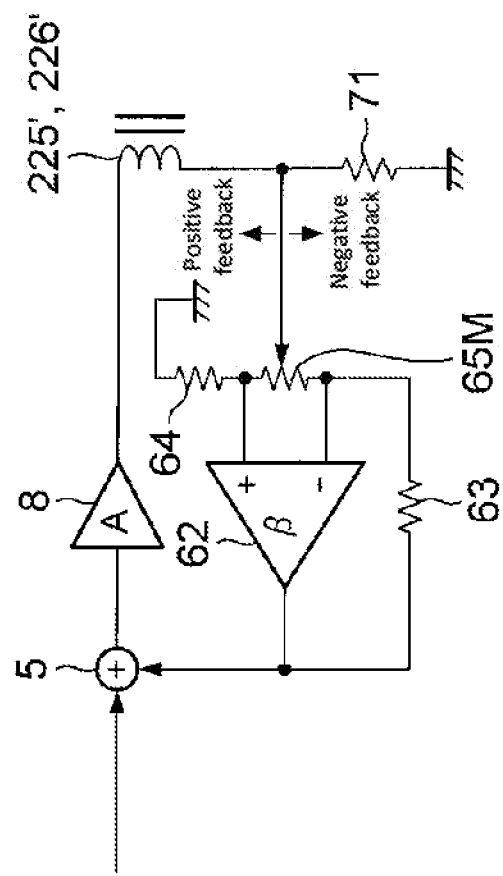
FIG. 15 is a circuit diagram showing a configuration example of a variable output impedance circuit using the constant current driving circuit.

FIG. 15 is a circuit diagram schematically showing the braking force control loop FBb in the present embodiment. Note that in FIG. 15, the current detection unit 7 is not shown.

In FIG. 15, a sliding resistor 65M includes the seven resistors 65 connected in series in FIG. 12. In the present embodiment, the switch circuit 66 of FIG. 12 switches the supply position of the current detection signal according to the braking force control signal. In the sliding resistor 65M, when the supply position of the current detection signal moves to the non-inverting input terminal side of the operational amplifier 62, the positive phase amplification gain of the variable polarity gain amplification unit 6 increases, so positive feedback control of the braking force control loop FBb is performed. On the other hand, when the supply position of the current detection signal moves to the inverting input terminal of the operational amplifier 62, the inverse amplification gain of the variable polarity gain amplification unit 6 increases, so negative feedback control of the braking force control loop FBb is performed. In the present embodiment, gain of positive feedback control and gain of negative feedback control are continuously controlled according to the braking force control signal. Accordingly, the braking force generated in the actuator 200A can be continuously controlled.

Specifically, when the voltage value of the braking force control signal is 0V, the gain of the amplifier 10 in which the current detection unit 7 and the variable polarity gain amplification unit 6 are combined becomes a negative gain having a large absolute value, and negative feedback control is performed with the braking force control loop FBb. In this case, the output impedance Zo of the driving unit 8 becomes a positive value having a large absolute value, and the driving unit 8 performs constant current driving of the coils 225' and 226' of the actuator 200A. At this time, the braking force that acts on the actuator 200A is zero.

When the voltage value of the braking force control signal increases from 0V, the absolute value of the negative gain of the amplifier 10 is gradually reduced, so the output impedance Zo of the driving unit 8 is reduced, and generation of braking force begins in the actuator 200A. When the voltage value of the braking force control signal reaches the vicinity of the center of a variable range of the braking force control signal, the gain of the amplifier 10 becomes zero, and the output impedance Zo of the driving unit 8 also becomes nearly zero. In this state, a constant voltage driving of the coils 225' and 226' is performed by the driving unit 8, and in the actuator 200A, electromagnetic braking is performed based on the characteristics of the actuator 200A itself.

Further, when the voltage value of the braking force control signal increases, the amplifier 10 performs positive phase amplification, and the output impedance Zo of the driving unit 8 is a negative impedance. Thus the braking force generated in the actuator 200A increases.

Above is described details of the braking force control performed in the present embodiment.

Figure 16:
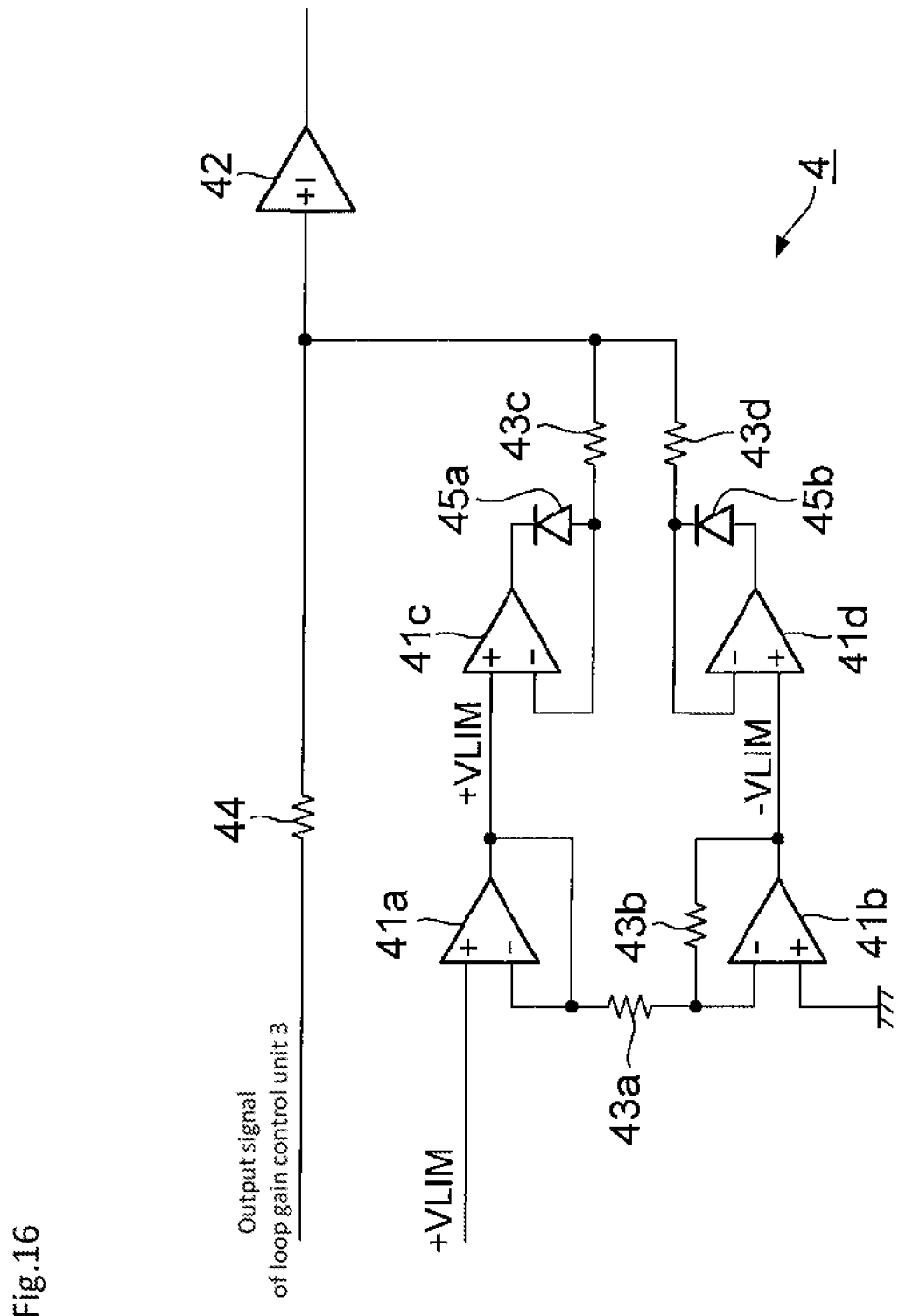
FIG. 16 is a circuit diagram showing a configuration example of a voltage limiter in the driving control apparatus.

Next, the loop gain control unit 3 and the voltage limiter 4 shown in FIG. 9 will be described in more detail. FIG. 16 is a circuit diagram showing a specific configuration example of the voltage limiter 4. The voltage limiter 4 has operational amplifiers 41a, 41b, 41c, and 41d, a buffer 42 having a gain of +1, resistors 43a, 43b, 43c, 43d, and 44, and diodes 45a and 45b.

Here, the operational amplifier 41a constitutes a voltage follower, and outputs the same voltage as a limit voltage +VLIM applied to a non-inverting input terminal. The limit voltage +VLIM is decided based on the pressure control signal.

A connection node of an inverting input terminal and an output terminal of the operational amplifier 41a are connected to an inverting input terminal of the operational amplifier 41b through the resistor 43a. In the operational amplifier 41b, a non-inverting input terminal is grounded, and the resistor 43b is connected between the inverting input terminal and the output terminal. Here, the resistance values of the resistors 43a and 43b are equal. Thus, the operational amplifier 41b outputs a limit voltage −VLIM obtained by inverting the polarity of the voltage limit +VLIM output by the operational amplifier 41a.

The limit voltage +VLIM output by the operational amplifier 41a is supplied to a non-inverting input terminal of the operational amplifier 41c. An anode of the diode 45a is connected to this inverting input terminal of the operational amplifier 41c, and a cathode of the diode 45a is connected to the output terminal.

The limit voltage −VLIM output by the operational amplifier 41b is supplied to a non-inverting input terminal of the operational amplifier 41d. A cathode of the diode 45b is connected to an inverting input terminal of the operational amplifier 41d, and an anode of the diode 45b is connected to the output terminal.

The resistor 44 is connected between the output terminal of the operational amplifier 31 of the loop gain control unit 3 in FIG. 9, and the input terminal of the buffer 42. The resistor 43c is connected between the anode of the diode 45a and the input terminal of the buffer 42. The resistor 43d is connected between the cathode of the diode 45b and the input terminal of the buffer 42. Here, the resistors 43c and 43d have the same resistance value. Also, the resistance values of the resistors 43c and 43d are significantly lower than the resistance value of the resistor 44.

In the above configuration, when the voltage value of the output signal of the loop gain control unit 3 is in a range between the limit voltage +VLIM and the limit voltage −VLIM, the diodes 45a and 45b are OFF. In this case, voltage limiting by the voltage limiter 4 does not operate, so the output signal of the loop gain control unit 3 is output without modification as the voltage value from the buffer 42.

When the voltage value of the output signal of the loop gain control unit 3 is higher than the limit voltage +VLIM, the diode 45a is ON, and current flows to the output terminal of the operational amplifier 41c through the resistors 44 and 43c and the diode 45a. At this time, in the operational amplifier 41c, the level of the output signal is set to a level lower than the limit voltage +VLIM by a forward voltage of the diode 45a, and the voltage of the inverting input terminal is caused to match the limit voltage +VLIM applied to the non-inverting input terminal. Therefore, a voltage obtained by weighting the output signal of the loop gain control unit 3 and the limit voltage +VLIM by a weighting coefficient based on the resistance values of the resistors 44 and 43c is supplied to the buffer 42. Here, the resistance value of the resistor 43c is significantly lower than the resistance value of the resistor 44, so the weighting coefficient for the limit voltage +VLIM is significantly larger than the weighting coefficient for the output signal of the loop gain control unit 3. Therefore, the voltage supplied to the buffer 42 is a voltage value that is substantially the same as the limit voltage +VLIM.

On the other hand, when the voltage value of the output signal of the loop gain control unit 3 is lower than the limit voltage −VLIM, the diode 45b is ON, and current flows out from the output terminal of the operational amplifier 41d through the diode 45b and the resistors 43d and 44. Operation in this case is the same as the operation when the voltage value of the output signal of the loop gain control unit 3 is higher than the limit voltage +VLIM, and the voltage supplied to the buffer 42 is substantially the same as the limit voltage −VLIM.

Above is described details of the voltage limiter 4.

Figure 17:
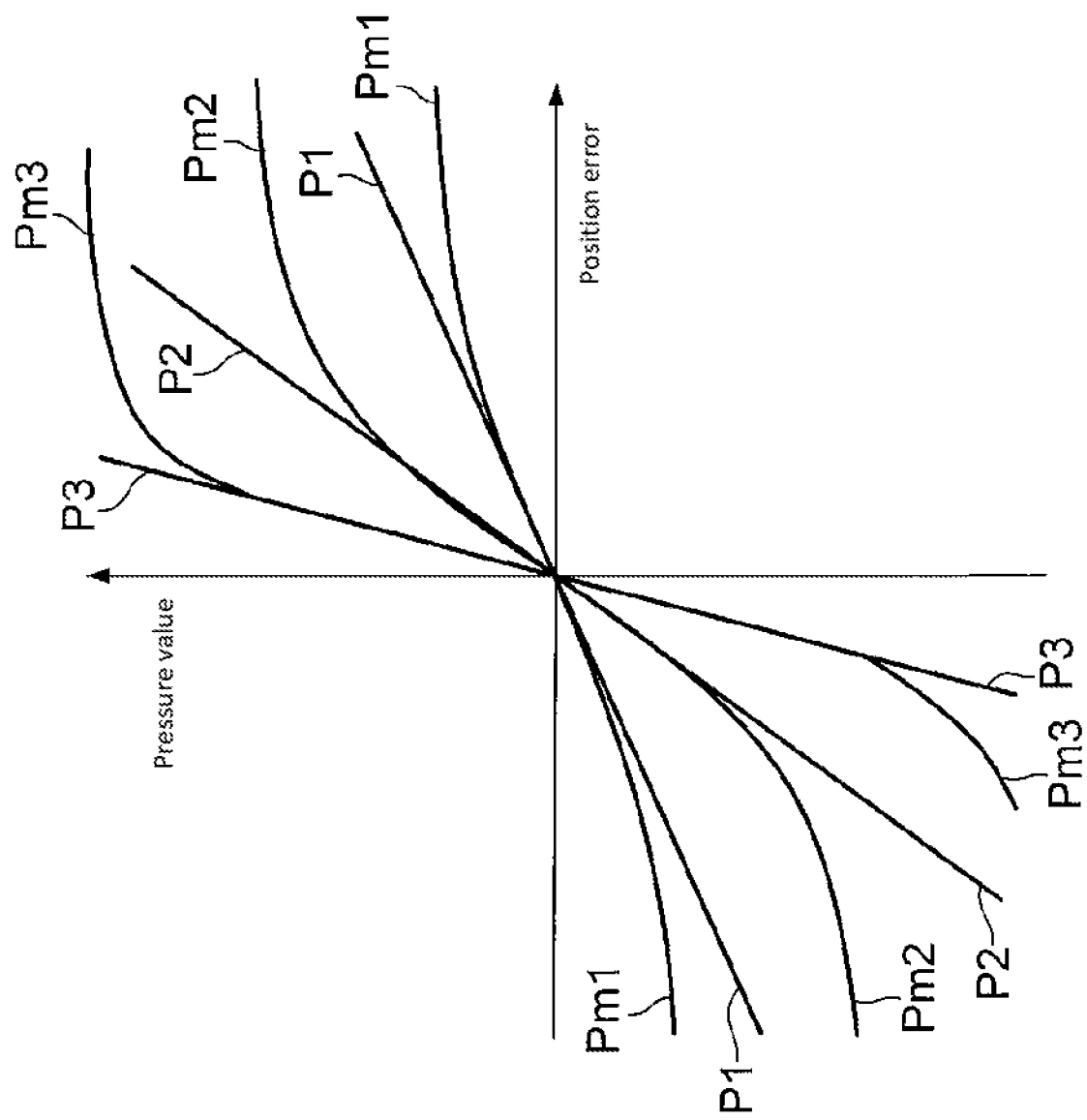
FIG. 17 is a diagram showing transfer characteristics of a circuit including a loop gain control unit and a voltage limiter in the same driving control apparatus.

FIG. 17 shows transfer characteristics of the loop gain control unit 3, and transfer characteristics of a circuit obtained by combining the loop gain control unit 3 and the voltage limiter 4. In FIG. 17, the horizontal axis represents the position error indicated by the position error signal, and the vertical axis represents the pressure value indicated by the output signal of the loop gain control unit 3 or the voltage limiter 4.

In the present embodiment, the gain of the output signal of the loop gain control unit 3 with respect to the position error signal, and the limit voltage +VLIM applied to the voltage limiter 4, are changed according to the pressure control signal. Specifically, as the signal value of the pressure control signal increases, the gain of the output signal of the loop gain control unit 3 with respect to the position error signal is increased, and in conjunction with this, the limit voltage +VLIM applied to the voltage limiter 4 is increased.

In FIG. 17, P1 to P3 represent output signals of the loop gain control unit 3 for respective changes of the pressure control signal. In this example, the signal value of the pressure control signal is set higher in the order of P1, P2, P3.

In FIG. 17, Pm1 to Pm3 represent output signals of the voltage limiter 4 that respectively correspond to the signals P1 to P3. As shown in FIG. 17, the output signals Pm1 to Pm3 of the voltage limiter 4, for changes in the position error, respectively increase in conjunction with the signals P1 to P3, and the slope becomes gradual and saturates as respective saturation voltages are approached. The saturation voltages of the signals Pm1 to Pm3 depend on the limit voltage +VLIM applied to the voltage limiter 4. In the present embodiment, as shown in FIG. 17, as the gain of the loop gain control unit 3 (the slope of the straight lines P1 to P3) is increased, the limit voltage +VLIM is also increased, and the saturation voltages of the signals Pm1 to Pm3 also increase.

The loop gain control unit 3 and the voltage limiter 4 described above constitute a pressure control unit for, by controlling the involvement of the position error signal in driving control of the actuator 200A, simulating the "force relaxation" and "rigidity" of a muscle. As described above, when using a spring to simulate a muscle, "force relaxation" and "rigidity" of the muscle can be regarded as the change of the spring constant. Therefore, in the present embodiment, as shown in FIG. 17, the gain (the slope where the spring constant=signals Pm1 to Pm3) with respect to the position error signals of the pressure instruction signals Pm1 to Pm3 that instruct the pressure to be generated by the actuator 200A is changed according to a pressure control signal (that is, the mode of involvement of the position error signal in driving control of the actuator 200A is changed). Thus, a configuration equivalent to "force relaxation" and "rigidity" of a muscle is realized in the actuator system.

Here, in an ordinary spring, if displacement increases, force (pressure) also proportionally increases, but in the case of a human muscle, when displacement is large, operation occurs so as to press with a constant force. Consequently, in the present embodiment, the signal value of the output signals (pressures) P1 to P3 of the loop gain control unit 3 are limited by the voltage limiter 4 according to the pressure control signal (that is, the involvement of the position error signal in driving control of the actuator 200A is limited), and output as the pressure instruction signals Pm1 to Pm3.

By adopting this sort of configuration, while taking advantage of the braking force control in the braking force control loop FBb, in an area where the position error signal is high, the signal value of the pressure instruction signal that is input to the addition unit 5 through the voltage limiter 4 can be limited to a constant value (the limit voltage +VLIM).

Operation Examples

Figure 18:
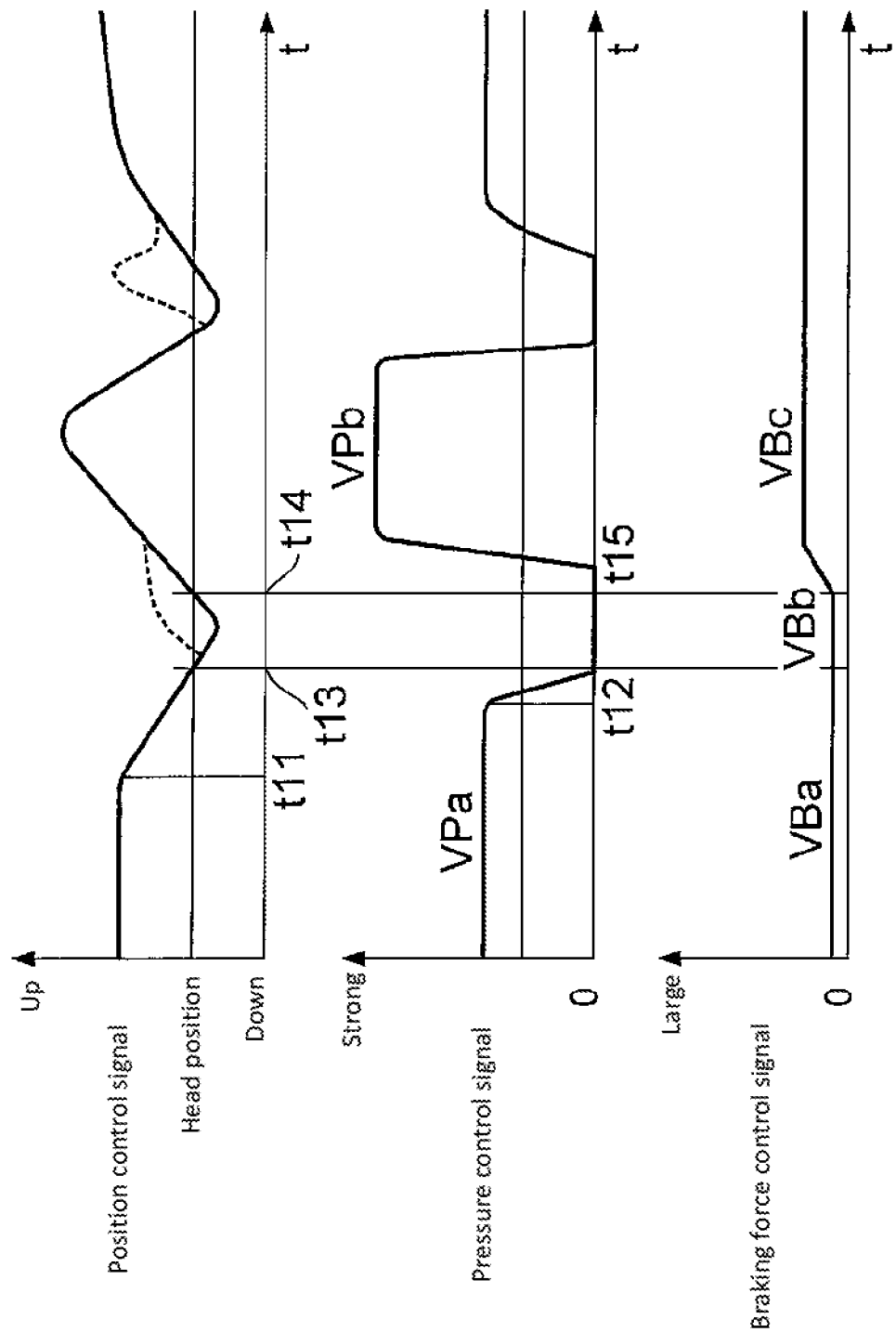
FIG. 18 is a time chart showing a first operation example of the same embodiment.

FIG. 18 is a time chart showing a first operation example of the present embodiment. In FIG. 18, the horizontal axis is the time axis, and the vertical axis represents signal values of various signals. This is similarly true for FIG. 19 referenced later.

In the first operation example, the robot arm 300 provided with the actuator 200A causes performance of a single stroke, which is a form of playing a drum. FIG. 18 shows respective waveforms of the position control signal, the pressure control signal and the braking force control signal supplied to the driving control apparatus 100 in order to cause the robot arm 300 to perform the single stroke. The position control signal, the pressure control signal, and the braking force control signal are generated by a host computer 500, which is the host device of the drive control device 100.

In FIG. 18, the position control signal is a signal instructing a target position of the tip of the drum stick. From this position control signal, the operating range and swing down speed of the drum stick are decided. In the first operation example, at a time t11, the position control signal, from a signal value corresponding to an initial position, towards a signal value corresponding to a position slightly lower than a head position, begins to decrease at a certain time slope. The reason for changing the position control signal to a signal value corresponding to a position slightly lower than the head position is so that even when the position of the drum shifts somewhat, the tip of the drum stick reliably strikes the head (skin).

At a time t11, the pressure control signal maintains a voltage value VPa decided based on a desired striking speed. The braking force control signal maintains a voltage VBa for establishing a state where the braking force nearly does not act. In this state, position control to eliminate the position error between the position indicated by the position control signal and the tip position (the position of the movable portion 11 in FIG. 9) of the drum stick 304 is performed in the position control loop FBa. In this case, the pressure control signal has the voltage value VPa, so the position error signal is amplified with a somewhat high gain corresponding to the voltage value VPa, and is supplied from the voltage limiter 4 as a pressure instruction signal to the addition unit 5. Further, because the braking force control signal has the voltage value VBa, negative feedback control is performed in the braking force control loop FBb, and a constant current corresponding to the pressure instruction signal output by the voltage limiter 4 is supplied to the actuator 200A. As a result, the robot arm 300 is driven by the pressure generated by the actuator 200A, and the tip of the drum stick 304 follows the position control signal to move towards the head position.

At a time t12 slightly before a time t13 when the tip of the drum stick 304 reaches the head position, the pressure control signal begins to decrease gradually. As a result, the gain that amplifies the position error signal decreases gradually, and the limit voltage +VLIM in the voltage limiter 4 also gradually decreases, so the pressure instruction signal supplied to the addition unit 5 is gradually weakened. That is, the extent of involvement of the position error signal in driving control of the actuator 200A weakens. For this reason, the pressure generated by the pressure actuator 200A also gradually weakens.

At a time t13 when the tip position of the drum stick 304 indicated by the position control signal matches the head position, the pressure control signal becomes 0, and for a predetermined time thereafter, the pressure control signal is maintained at 0.

During the period where the pressure control signal is 0, the gain of the loop gain control unit 3 is set to 0, and the pressure instruction signal supplied to the addition unit 5 is 0. In this case, the braking force control signal has the voltage value VBa, so in the braking force control loop FBb, negative feedback control acts to set the current flowing through the actuator 200A to 0, and thereby constant current driving of the actuator 200A is performed. As a result, the actuator 200A enters a state of complete "force relaxation".

Within the period when the pressure control signal is maintained at 0, the signal value of the position control signal becomes a signal value corresponding to a lowest position slightly under the head position, and then rises. However, during this period, the pressure instruction signal is 0, so the actuator 200A is in the "force relaxation state", and the tip of the drum stick does not follow the position control signal. The lower arm portion 302 and the drum stick 304 of the robotic arm 300 are in a free state without binding from the actuator 200A, and move by inertia such that the tip of the drum stick 304 collides with the head surface. Thereafter, the tip of the drum stick 304 floats away from the head position due to a reaction from the head surface. The behavior of the tip of the drum stick 304 is indicated by a broken line in FIG. 18.

Then, the position indicated by the position control signal moves below the head position at a time t13, turns to rise at a position slightly below the head position, and at a time t14, rises above the head position, and thereafter reaches a maximum position.

Here, in the period from a time t13 to a time t14, the voltage value of the braking force control signal is set to the voltage value VBb. This voltage value VBb is set in consideration of a malfunction due to a sound quality preference regarding the impact sound of the drum stick 304, and the bouncing condition of the drum stick 304.

Then, at a time t14, the braking force control signal starts to increase from the voltage value VBb, and afterward, the voltage value of the braking force control signal becomes a voltage value VBc greater than the voltage value VBb. At a time t15 slightly after a time t14, the pressure control signal rises, and afterward, the voltage value of the pressure control signal becomes a voltage value VPb greater than the voltage value VPa.

Then, after a time t1, the position control signal becomes a minimum value between a time t13 and a time t14, then rises and reaches a maximum value. During this period, the voltage value of the pressure control signal is the voltage value VPb, so the position error signal is amplified by a high gain corresponding to the voltage value VPb, and applied to the braking force control loop FBb as a position instruction signal. Therefore, constant current driving of the actuator 200A is performed based on the pressure instruction signal, and the tip of the drum stick 304 is lifted to a position corresponding to the maximum value so as to follow the position control signal. At this time, a braking force control signal having the voltage value VBc greater than the voltage value VBb is applied to the braking force control loop FBb, so a larger braking force than at times t13 and t14 is generated in the actuator 200A. The reason for this is that, in this process whereby the position control signal proceeds towards the maximum value, the tip of the drum stick 304 returns rapidly from the head position to a high position, so it is necessary to generate a braking force against the rebounding of the drum stick 304 in order to stop the drum stick 304.

Afterward, the tip position of the drum stick 304 indicated by the position control signal moves towards a position slightly below the head position. Subsequent operation is the same as described above.

Figure 19:
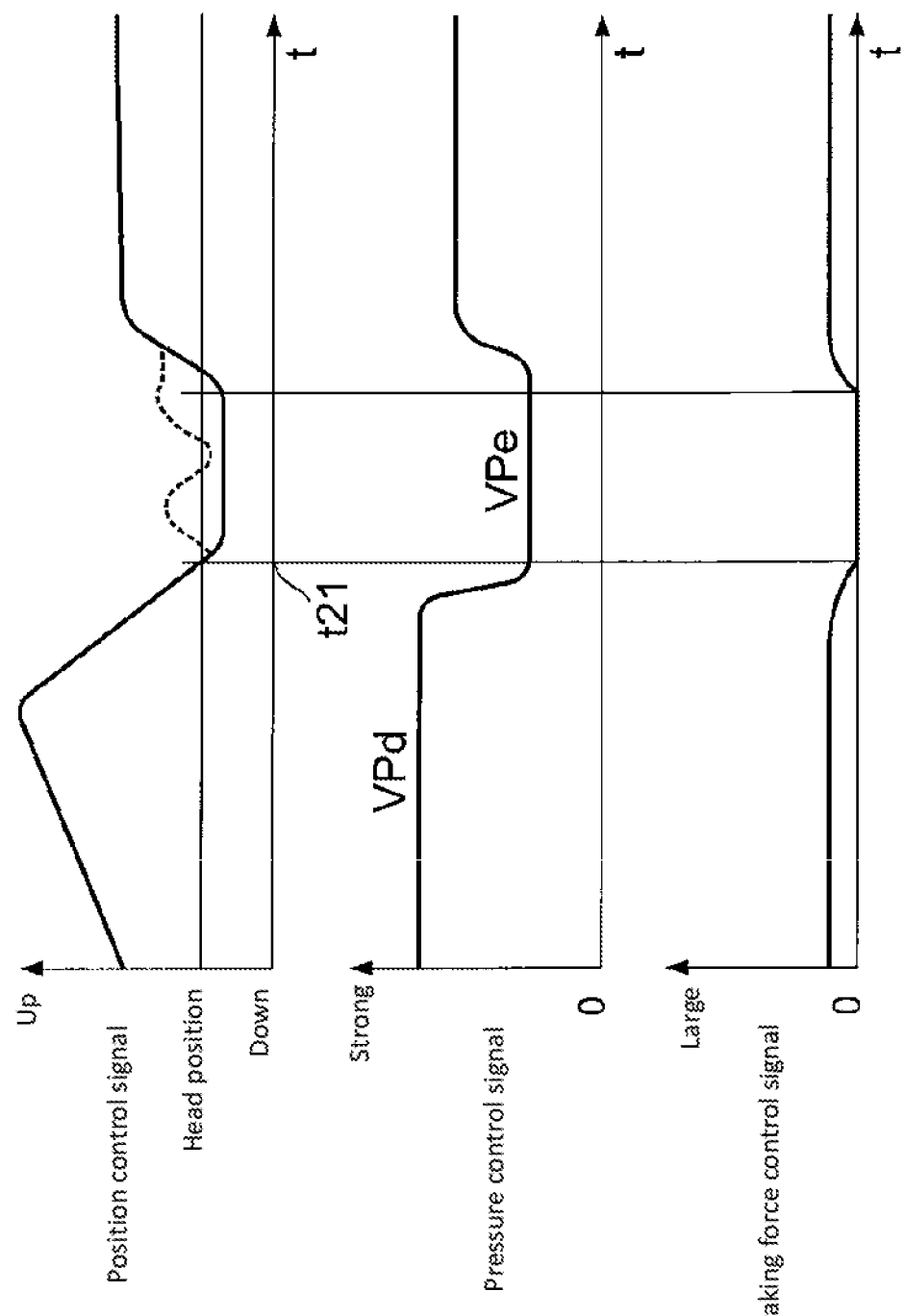
FIG. 19 is a time chart showing a second operation example of the same embodiment.

FIG. 19 is a time chart showing a second operation example of the present embodiment. In the second operation example, the robot arm 300 provided with the actuator 200A is caused to perform a roll, which is another form of drum playing.

In this operation example, the tip end position of the drum stick 304 indicated by the position control signal is lowered from the maximum value to drop below the head position at a time t21, and thereafter, a position slightly below the head position is maintained for a predetermined time period.

During a period of a predetermined length of time after a time t21, the pressure control signal is a voltage value VPe lower than the previous voltage value VPd. In the case of a single stroke as described above, the pressure control signal is set to 0 in the same conditions. In contrast, in the case of a roll, the voltage value of the pressure control signal is set to the voltage value VPe. Also, in the case of a roll, during a period of a predetermined length of time after a time t21, the braking force control signal is set to 0, and negative feedback control is performed in the braking force control loop FBb to set the braking force to 0.

By adopting such a configuration, even after the tip of the drum stick 304 hits the head face, the position error signal is amplified with a gain corresponding to the voltage value VPe of the pressure control signal, and this is supplied to the constant current feedback control loop FBb as a pressure instruction signal. As a result, as indicated by a broken line in FIG. 19, after the tip of the drum stick 304 bounces back from the head face, by operation of the pressure instruction signal, a behavior of returning the tip of the drum stick 304 to the position indicated by the position control signal is repeated. In this way, roll operation is realized by the actuator system.

As described above, according to the present embodiment, in driving control of the actuator 200A performed in the position control loop FBa of the position error signal, involvement of the position error signal in driving control of the actuator 200A is controlled. Specifically, control is performed based on the pressure control signal of the gain and voltage limit applied to the position error signal. As a result, it is possible to control force relaxation of the actuator 200A. Further, according to the braking force control signal, gain and polarity applied to the position detection signal in the braking force control loop FBb are controlled, and the output impedance Zo of the driving unit 8 is controlled. As a result, it is possible to freely control the braking force generated in the actuator 200A. Therefore, according to the present embodiment, the feedback control FB2 of unconscious motion and the feedback control FB3 to decide properties and individual characteristics described above are realized also in control of the actuator 200A, so it is possible to cause a robot to play a musical instrument in a similar manner as a human.

Second Embodiment

In the first embodiment, the driving control apparatus for the actuator is realized by an analog circuit. However, part or nearly all of the driving control apparatus according to the first embodiment can also be realized by a processor such as a digital circuit or a DSP (Digital Signal Processor), or the like.

Figure 20:
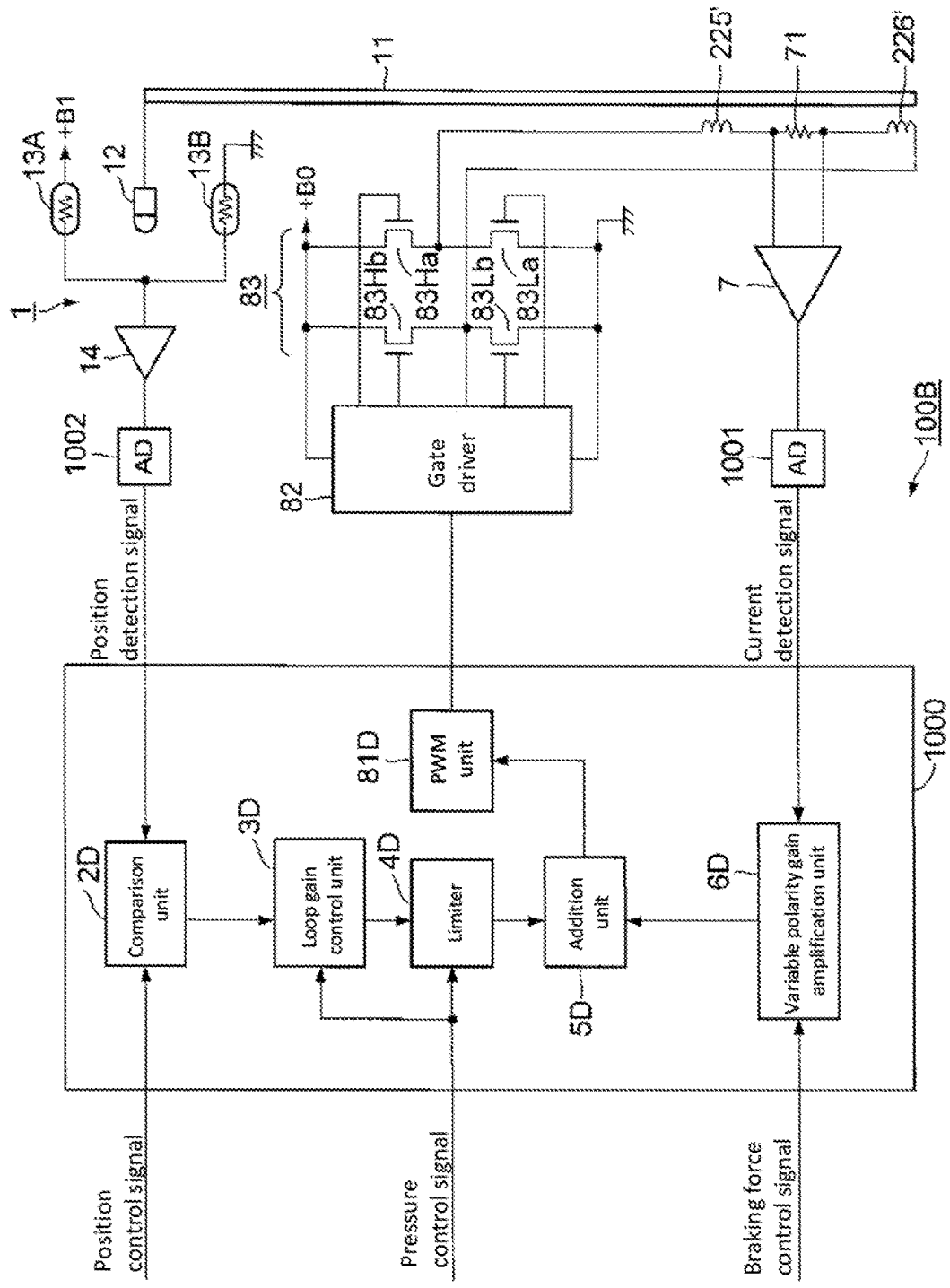
FIG. 20 is a block diagram showing the configuration of a driving control apparatus for an actuator according to a second embodiment of the invention.

FIG. 20 is a block diagram showing the configuration of a driving control apparatus 100B according to a second embodiment of the invention. Note that in FIG. 20, elements corresponding to elements shown in FIG. 9 are assigned the same reference numerals, and a description thereof is omitted here.

In the driving control apparatus 100B, an analog current detection signal is output from the current detection unit 7 and converted by an AD converter 1001 to a digital current detection signal, and this is supplied to a control core 1000. Further, in the driving control apparatus 100B, an analog position detection signal output from the position detection unit 1 is converted by an AD converter 1002 to a digital position detection signal, and this is supplied to the control core 1000.

The control core 1000 is configured from a digital signal processing circuit or a DSP. The control core 1000 includes a comparison unit 2D, a loop gain control unit 3D, a limiter 4D, an addition unit 5D, a variable polarity gain amplification unit 6D, and a PWM unit 81D that perform digital processing equivalent to the analog processing performed by the comparison unit 2, the loop gain control unit 3, the voltage limiter 4, the addition unit 5, the variable polarity gain amplification unit 6 and the PWM unit 81 in the first embodiment.

In the driving control apparatus 100B, a PWM pulse stream generated by digital signal processing by the PWM unit 81D is supplied to the gate driver 82 outside of the control core 1000.

In this embodiment, the same effects as in the first embodiment can be obtained.

Other Embodiments

While first and second embodiments of the present invention are described above, other embodiments of the present invention are also conceivable. For example, as follows.

(1) In the braking force control loop FBb of the above first embodiment, feedback control of the current flowing through the coils 225' and 226' (or torque generated in the coils 225' and 226') was performed, but feedback control of the speed of the movable portion 11 (more specifically the tip of the drum stick 304) driven by the actuator 200A may also be performed. More specifically, a configuration may be adopted in which the movable portion 11 (and more specifically the coil holder 220A) driven by the actuator 200A is provided with a speed detection coil, and feedback control of the output voltage of the speed detection coil is performed. When doing so, gain of the feedback amount and polarity are controlled by the braking force control signal. Alternatively, a configuration may be adopted in which, in the first embodiment, the position detection signal is converted to a speed signal by a differentiating circuit, and feedback control of the speed signal is performed in the braking force control loop FBb. Alternatively, a configuration may be adopted in which the movable portion 11 (more specifically the coil holder 220A) driven by the actuator 200A is provided with an acceleration pickup, an output signal of the acceleration pickup is converted to a speed signal by an integration circuit, and feedback control of the speed signal is performed in the braking force control loop FBb. This is similarly true for the second embodiment.

(2) In the above first embodiment, in the actuator 200A, the length L1 in the axial direction of the permanent magnets 231 to 234 is longer than the length L2 in the axial direction of the coils 225' and 226'. However, conversely, the length L2 in the axial direction of the coils 225' and 226' may be longer than the length L1 in the axial direction of the permanent magnets 231 to 234.

(3) Although the invention is applied to musical instrument performance in each of the above embodiments, the range of application of the present invention is not limited thereto. For example, the driving control apparatus according to the present invention is also applicable to an actuator of a shoulder tapping robot, or the like.

Features

According to the above embodiments, it is possible to control relaxation of force in driving control of an actuator. Further, it is possible to control the involvement of a position error signal in control of actuator pressure according to a pressure control signal. Thus, by weakening the involvement of the position error signal in control of actuator pressure with the pressure control signal, it is possible to weaken the operation of actuator pressure control based on the position error signal, and thereby realize a force relaxation state.

LIST OF REFERENCE NUMERALS

300 Robot arm
301 Upper arm portion
302 Lower arm portion
303 Joint
304 Drum stick
200A Actuator
299 Connecting rod
210 Housing
211, 212, 213a, 213b, 214a, 214b Outer yoke
215 Inner yoke
220A Coil holder
225', 226' Coil
222a', 222b' Bar portion
223 Bridge portion
227, 228 Recessed portion
231, 232, 233, 234 Permanent magnet
400 Body
FB1 Feedback control of conscious motion
FB2 Feedback control of unconscious motion
FB3 Feedback control to decide properties and individual characteristics
FBa Position control loop
FBb Braking force control loop
1 Position detection unit
11 Movable portion
2, 2D Comparison unit
3, 3D Loop gain control unit
4 Voltage limiter
4D Limiter
5, 5D Addition unit
6, 6D Variable polarity gain amplification unit
7 Current detection unit
8 Driving unit
12 Light source
13A, 13B Light receiving element
14, 23, 53, 42 Buffer
10 Amplifier
32 Gain switching unit
81, 81D PWM unit
82 Gate driver
83 Output stage unit
83Ha, 83Hb, 83La, 83Lb N channel transistor
62, 141, 142, 720, 41a, 41b, 41c, 41d Operational amplifier
143, 144, 63, 64, 65, 701 to 706, 43a, 43b, 43c, 43d Resistor
711 to 716 Capacitor
14 Variable gain amplifying unit
15 Sliding resistor
45a, 45b Diode
1001, 1002 AD converter
500 Host computer

The invention claimed is:

1. A driving system for an actuator, the driving system comprising:
a driving circuit configured to drive the actuator according to a driving control signal;
a first amplifier configured to control, according to a pressure control signal, gain of the driving control signal to be supplied to the driving circuit; and
a second amplifier configured to control, according to a braking force control signal, an output impedance of the driving circuit to control a braking force generated in the actuator, wherein
the second amplifier and the driving circuit are in a braking force control loop configured to cause the driving circuit to output a driving current according to a pressure instruction signal and control the output impedance of the driving circuit, by controlling feedback of the driving current of the actuator in the braking force control loop, and
the first amplifier is further configured to generate the pressure instruction signal by processing the driving control signal based on the pressure control signal.

2. The driving system according to claim 1, wherein
the second amplifier is further configured to control, according to the braking force control signal, the braking force against pressure toward a target position of a movable portion driven by the actuator, generated by the actuator according to the driving control signal.

3. The driving system according to claim 1, wherein
the braking force control loop is further configured to control, according to the braking force control signal, gain and polarity of the feedback in the braking force control loop.

4. The driving system according to claim 3, further comprising:
a limiter connected between the first amplifier and the braking force control loop configured to limit the pressure instruction signal to within a limit range decided by the pressure control signal.

5. The driving system according to claim 3, wherein the first amplifier is further configured to control gain of the pressure instruction signal relative to the driving control signal based on the pressure control signal.

6. The driving system according to claim 1, further comprising:
a limiter connected between the first amplifier and the braking force control loop configured to limit the pressure instruction signal to within a limit range decided by the pressure control signal.

7. The driving system according to claim 6, wherein the first amplifier is further configured to control gain of the pressure instruction signal relative to the driving control signal based on the pressure control signal.

8. The driving system according to claim 1, wherein the first amplifier is further configured to control gain of the pressure instruction signal relative to the driving control signal based on the pressure control signal.

9. A driving control system, comprising:
the driving system according to claim 1; and
a host computer configured to supply the driving control signal and the pressure control signal to the driving system.

10. A driving control system, comprising:
a movable portion;
an actuator configured to control driving of the movable portion; and
the driving system according to claim 1.

11. A driving system for an actuator, the driving system comprising:
a driving circuit configured to drive the actuator according to a driving control signal;
a first amplifier configured to control, according to a pressure control signal, gain of the driving control signal to be supplied to the driving circuit; and
a second amplifier configured to control, according to a braking force control signal, an output impedance of the driving circuit to control a braking force generated in the actuator, wherein the driving control signal is a position error signal indicating a position error between a position detection signal indicating a detected position of a movable portion driven by the actuator, and a position control signal instructing a target position of the movable portion;
the second amplifier and the driving circuit are in a braking force control loop configured to cause the driving circuit to output a driving current according to a pressure instruction signal and perform control of the output impedance of the driving circuit, by controlling feedback of the driving current of the actuator in the braking force control loop; and
the first amplifier is further configured to generate the pressure instruction signal by processing the driving control signal based on the pressure control signal.

12. The driving system according to claim 11, wherein the second amplifier is further configured to control, according to the braking force control signal, the braking force against pressure toward the target position, generated by the actuator according to the driving control signal.

13. The driving system according to claim 11, wherein the braking force control loop is further configured to control, according to the braking force control signal, gain and polarity of the feedback in the braking force control loop.

14. A driving control system, comprising:
the driving system according to claim 11; and
a host computer configured to supply the driving control signal and the pressure control signal to the driving system.

15. A driving control system, comprising:
a movable portion;
an actuator configured to control driving of the movable portion; and
the driving system according to claim 11.

* * * * *